United States Patent
Kokubo et al.

(10) Patent No.: US 9,496,468 B2
(45) Date of Patent: *Nov. 15, 2016

(54) CURABLE RESIN COMPOSITION, CURABLE RESIN COMPOSITION TABLET, MOLDED BODY, SEMICONDUCTOR PACKAGE, SEMICONDUCTOR COMPONENT AND LIGHT EMITTING DIODE

(71) Applicant: KANEKA CORPORATION, Osaka (JP)

(72) Inventors: Tadashi Kokubo, Osaka (JP); Katsuya Ouchi, Settsu (JP); Takahisa Iwahara, Settsu (JP); Kazuhiko Hirabayashi, Settsu (JP); Hiroshi Okoshi, Settsu (JP); Tomokazu Tozawa, Settsu (JP); Shuhei Ozaki, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/643,609

(22) Filed: Mar. 10, 2015

(65) Prior Publication Data
US 2015/0188008 A1    Jul. 2, 2015

Related U.S. Application Data

(62) Division of application No. 13/638,992, filed as application No. PCT/JP2011/058047 on Mar. 30, 2011.

(30) Foreign Application Priority Data

| Apr. 2, 2010 | (JP) | 2010-085900 |
| Apr. 2, 2010 | (JP) | 2010-085901 |
| Jun. 18, 2010 | (JP) | 2010-139362 |
| Oct. 8, 2010 | (JP) | 2010-228853 |
| Nov. 11, 2010 | (JP) | 2010-252977 |
| Jan. 25, 2011 | (JP) | 2011-013229 |
| Feb. 24, 2011 | (JP) | 2011-038455 |

(51) Int. Cl.
*H01L 33/56* (2010.01)
*H01L 23/29* (2006.01)
(Continued)

(52) U.S. Cl.
CPC .............. *H01L 33/56* (2013.01); *C08K 3/22* (2013.01); *C08K 3/36* (2013.01); *C08K 5/098* (2013.01);
(Continued)

(58) Field of Classification Search
None
See application file for complete search history.

(56) References Cited

U.S. PATENT DOCUMENTS

| 5,021,494 A | 6/1991 | Toya |
| 5,438,094 A | 8/1995 | Fujiki et al. |

(Continued)

FOREIGN PATENT DOCUMENTS

| CN | 1798811 A | 7/2006 |
| JP | 7-173331 A | 7/1995 |

(Continued)

OTHER PUBLICATIONS

International Preliminary Report on Patentability (Form PCT/ISA/2370) (4pages) of International Application No. PCT/JP2011/058047 mailed May 31, 2011 with Form PCT/IB/373 (1page), English translation Only.

(Continued)

*Primary Examiner* — Robert S Loewe
(74) *Attorney, Agent, or Firm* — Westerman, Hattori, Daniels & Adrian, LLP

(57) ABSTRACT

The present invention aims to provide a curable resin composition which gives a cured product having a low linear expansion coefficient. The curable resin composition of the present invention contains, as essential components, (A) an organic compound having at least two carbon-carbon double bonds reactive with SiH groups per molecule, (B) a compound containing at least two SiH groups per molecule, (C) a hydrosilylation catalyst, (D) a silicone compound having at least one carbon-carbon double bond reactive with a SiH group per molecule, and (E) an inorganic filler.

25 Claims, 2 Drawing Sheets

(51) Int. Cl.
*H01L 33/60* (2010.01)
*H01L 23/31* (2006.01)
*C08K 3/22* (2006.01)
*C08K 3/36* (2006.01)
*C08K 5/098* (2006.01)
*H01L 23/495* (2006.01)
*H01L 33/62* (2010.01)

(52) U.S. Cl.
CPC ........... *H01L 23/295* (2013.01); *H01L 23/296* (2013.01); *H01L 23/3171* (2013.01); *H01L 23/49586* (2013.01); *H01L 33/60* (2013.01); *H01L 33/62* (2013.01); *C08K 2003/2241* (2013.01); *H01L 2924/0002* (2013.01)

(56) References Cited

U.S. PATENT DOCUMENTS

| | | |
|---|---|---|
| 6,624,231 B2 | 9/2003 | Shiono |
| 6,770,326 B2 | 8/2004 | Sanders et al. |
| 6,806,509 B2 | 10/2004 | Yoshino et al. |
| 6,884,660 B2 | 4/2005 | Tetsuka et al. |
| 7,498,085 B2 | 3/2009 | Kashiwagi et al. |
| 7,595,515 B2 | 9/2009 | Thompson et al. |
| 7,625,986 B2 | 12/2009 | Yoshitake et al. |
| 8,013,056 B2 | 9/2011 | Taguchi et al. |
| 8,092,735 B2 | 1/2012 | Thompson et al. |
| 2002/0014692 A1 | 2/2002 | Yamada et al. |
| 2005/0049357 A1 | 3/2005 | Zhong et al. |
| 2005/0209400 A1 | 9/2005 | Tsumura et al. |
| 2005/0244649 A1 | 11/2005 | Kashiwagi et al. |
| 2006/0261366 A1 | 11/2006 | Yang |
| 2007/0100072 A1 | 5/2007 | Akitomo et al. |
| 2007/0219312 A1 | 9/2007 | David |
| 2007/0221939 A1 | 9/2007 | Taskar et al. |
| 2008/0185601 A1 | 8/2008 | Frisch et al. |
| 2009/0008673 A1 | 1/2009 | Kato et al. |
| 2009/0050925 A1 | 2/2009 | Kuramoto et al. |
| 2009/0121180 A1 | 5/2009 | Tsubokawa et al. |
| 2009/0123764 A1 | 5/2009 | Morita et al. |
| 2009/0171013 A1 | 7/2009 | Taguchi et al. |
| 2009/0258216 A1 | 10/2009 | Yamakawa et al. |
| 2009/0304961 A1 | 12/2009 | Taguchi et al. |
| 2009/0306263 A1 | 12/2009 | Taguchi et al. |
| 2009/0309116 A1 | 12/2009 | Kato et al. |
| 2009/0315049 A1 | 12/2009 | Urasaki et al. |
| 2010/0001311 A1 | 1/2010 | Taguchi et al. |
| 2010/0065880 A1* | 3/2010 | Kashiwagi .......... C03C 25/1095 257/99 |
| 2010/0081748 A1* | 4/2010 | Taguchi ................. C08L 83/04 524/433 |
| 2010/0140638 A1 | 6/2010 | Kotani et al. |
| 2010/0276721 A1 | 11/2010 | Yoshitake et al. |
| 2011/0241048 A1* | 10/2011 | Taguchi ................. H01L 33/60 257/98 |
| 2011/0311767 A1 | 12/2011 | Elahee |

FOREIGN PATENT DOCUMENTS

| | | |
|---|---|---|
| JP | 9-12853 A | 1/1997 |
| JP | 2001-207059 A | 7/2001 |
| JP | 2003-261770 A | 9/2003 |
| JP | 2005-146191 A | 6/2005 |
| JP | 2005-343984 A | 12/2005 |
| JP | 2006-156704 A | 6/2006 |
| JP | 2007-112975 A | 5/2007 |
| JP | 2007-235085 A | 9/2007 |
| JP | 2008-078638 A | 4/2008 |
| JP | 2008-252135 A | 10/2008 |
| JP | 2009-030019 A | 2/2009 |
| JP | 2009-062490 A | 3/2009 |
| JP | 2009-155415 A | 7/2009 |
| JP | 2009-179670 A | 8/2009 |
| JP | 2009-269968 A | 11/2009 |
| JP | 2009-280747 A | 12/2009 |
| JP | 2009-302241 A | 12/2009 |
| JP | 2010-001474 A | 1/2010 |
| JP | 2010-018719 A | 1/2010 |
| JP | 2010-018786 A | 1/2010 |
| JP | 2010-021533 A | 1/2010 |
| JP | 2010-062272 A | 3/2010 |
| JP | 2010-229402 A | 10/2010 |
| JP | 2011-140550 A | 7/2011 |
| WO | 2005/012432 A1 | 2/2005 |
| WO | 2007/119627 A1 | 10/2007 |
| WO | 2007/142018 A1 | 12/2007 |
| WO | 2008/059856 A1 | 5/2008 |
| WO | 2010/111921 A1 | 10/2010 |

OTHER PUBLICATIONS

International Search Report of PCT/JP2011/058047, mailing date May 31, 2011.

Informational sheet for R-820 titanium dioxide, 1 page, date not given.

U.S. Office Action dated Mar. 30, 2015, issued in U.S. Appl. No. 13/638,992 (17 pages).

* cited by examiner

View from lateral side     View from longitudinal side

CURABLE RESIN COMPOSITION, CURABLE RESIN COMPOSITION TABLET, MOLDED BODY, SEMICONDUCTOR PACKAGE, SEMICONDUCTOR COMPONENT AND LIGHT EMITTING DIODE

CROSS-REFERENCE TO RELATED APPLICATIONS

This application is a divisional of U.S. application Ser. No. 13/638,992, filed on Oct. 2, 2012, which is a 371 of International Application No. PCT/JP2011/058407, filed on Mar. 30, 2011, which is based upon and claims the benefit of priority from prior Japanese Patent Application No. 2010-085900, filed on Apr. 2, 2010, Japanese Patent Application No. 2010-085901, filed on Apr. 2, 2010, Japanese Patent Application No. 2010-139362, filed on Jun. 18, 2010, Japanese Patent Application No. 2010-228853, filed on Oct. 8, 2010, Japanese Patent Application No. 2010-252977, filed on Nov. 11, 2010, Japanese Patent Application No. 2011-013229, filed on Jan. 25, 2011, Japanese Patent Application No. 2011-038455, filed on Feb. 24, 2011, the entire contents of which are incorporated herein by reference.

TECHNICAL FIELD

The present invention relates to a curable resin composition, a curable resin composition tablet, a molded article, a semiconductor package, a semiconductor component, and a light-emitting diode.

BACKGROUND ART

Various shapes of packages containing curable resins have been conventionally used in semiconductors. Such packages contain various metallic materials, which are often integrally molded with the curable resins, for the purposes such as electrically connecting the semiconductors to the outside of the packages, maintaining the strength of the packages, or conducting heat generated from the semiconductors to the outside of the packages.

However, resin generally has a large linear expansion coefficient which is not likely to be matched to the linear expansion coefficient of metallic materials that is generally small. For this reason, some problems, such as warpage, peeling, cracking, and damage to semiconductors, may occur during heat-molding, post-curing, or various processes involving heating and cooling when used as semiconductor components.

Regarding particularly to warpage caused by mismatch of the linear expansion coefficients, a method of molding a curable resin evenly on both sides of a metal has been employed to reduce the warpage.

However, since, in these days, increase in the amount of heat generated from semiconductors has required a design that is excellent in heat dissipation, package designs have been introduced in which a metal to be bonded to a semiconductor element forms a bottom of the package in order to efficiently conduct heat outside the package (Patent Literatures 1 and 2).

In this case, warpage cannot be reduced by the above method, and thus solving the warpage problem is an important issue.

Some improvement of resin in terms of reduction of warpage has been achieved by lowering the linear expansion of resin to be closer to the linear expansion of a metal with which the resin is integrally molded, or by using a resin having a lower elastic modulus.

However, since addition of a large amount of inorganic filler in order to lower the linear expansion reduces the fluidity of resin during molding, and thereby deteriorates the molding processability, such a technique has a limitation. Moreover, a lower elastic modulus corresponds to a reduced strength of resin, leading to loss of the primary function of packages, that is, protection of the semiconductor element.

For the above reasons, curable resins capable of reducing warpage in semiconductor packages have been demanded.

Meanwhile, due to the increase in heat (also light in the case where semiconductors are light-emitting diodes) generated from semiconductors, resins for semiconductor packages have been demanded to have higher thermal resistance (light resistance). In response to such demand, some resins which have high thermal resistance and are cured by hydrosilylation reaction have been employed as resins for semiconductor packages (Patent Literatures 1 and 3).

CITATION LIST

Patent Literature

Patent Literature 1: JP-A 2010-62272
Patent Literature 2: JP-A 2009-302241
Patent Literature 3: JP-A 2005-146191

SUMMARY OF INVENTION

Technical Problem

In this context, the present invention aims to provide a curable resin composition which gives a cured product having a low linear expansion coefficient. The present invention also aims to provide a semiconductor package which is formed by integrally molding the curable resin composition and a metal, and has reduced warpage, and also to provide a semiconductor produced by using the semiconductor package.

Solution to Problem

The present inventors have made intensive studies to solve the above problems. As a result, they have found that a curable resin composition containing, as essential components, (A) an organic compound having at least two carbon-carbon double bonds reactive with SiH groups per molecule, (B) a compound containing at least two SiH groups per molecule, (C) a hydrosilylation catalyst, (D) a silicone compound having at least one carbon-carbon double bond reactive with a SiH group per molecule, and (E) an inorganic filler can solve the above problems, thereby completing the present invention.

Namely, the present invention relates to the following features:

(1) a curable resin composition containing, as essential components, (A) an organic compound having at least two carbon-carbon double bonds reactive with SiH groups per molecule, (B) a compound containing at least two SiH groups per molecule, (C) a hydrosilylation catalyst, (D) a silicone compound having at least one carbon-carbon double bond reactive with a SiH group per molecule, and (E) an inorganic filler;

(2) the curable resin composition according to the above (1), wherein the component (D) is a linear polysiloxane containing a vinyl group at a terminal thereof;

(3) the curable resin composition according to the above (1) or (2), wherein the component (D) has a weight average molecular weight of at least 1,000 but not more than 1,000,000;

(4) the curable resin composition according to any one of the above (1) to (3), wherein the component (E) is spherical silica;

(5) the curable resin composition according to any one of the above (1) to (4), further containing (F) a white pigment;

(6) the curable resin composition according to the above (5), wherein the component (F) has an average particle size of 1.0 μm or less;

(7) the curable resin composition according to the above (5) or (6), wherein the component (F) is titanium oxide;

(8) the curable resin composition according to the above (7), wherein the component (F) is titanium oxide that is surface-treated with an organosiloxane;

(9) the curable resin composition according to the above (7), wherein the component (F) is titanium oxide that is surface-treated with an inorganic compound;

(10) the curable resin composition according to the above (9), wherein the component (F) is surface-treated with an aluminum compound;

(11) the curable resin composition according to the above (5) or (6), wherein the component (F) is at least one selected from the group consisting of zinc oxide, zirconium oxide, strontium oxide, niobium oxide, boron nitride, barium titanate, and barium sulfate;

(12) the curable resin composition according to any one of the above (1) to (11), further containing (G) a metal soap;

(13) the curable resin composition according to the above (12), wherein the component (G) is a metal stearate;

(14) the curable resin composition according to the above (13), wherein the component (G) is at least one selected from the group consisting of calcium stearate, magnesium stearate, zinc stearate, and aluminum stearate;

(15) the curable resin composition according to any one of the above (1) to (14), wherein the component (D) is contained in an amount of 30% by weight or more of the total weight of the component (A) and the component (B);

(16) the curable resin composition according to any one of the above (1) to (15), wherein the component (E) is contained in a total amount of 70% by weight or more of the whole curable resin composition;

(17) the curable resin composition according to any one of the above (5) to (16), wherein the component (F) is contained in an amount of 10% by weight or more of the whole curable resin composition;

(18) the curable resin composition according to any one of the above (12) to (17), wherein the component (G) is contained in an amount of 0.01% to 5% by weight of the whole curable resin composition;

(19) the curable resin composition according to any one of the above (1) to (18), wherein a cured product of the curable resin composition has a spectral reflectance of 80R % or more at 420 nm, 440 nm, and 460 nm, and has a spectral reflectance retention rate ([spectral reflectance after thermal resistance test]/[initial spectral reflectance]×100) of 90% or more after a thermal resistance test at a temperature of 180° C. for 72 hours;

(20) the curable resin composition according to any one of the above (1) to (19), wherein a surface of a molded article formed by curing the curable resin composition has a light reflectance at a wavelength of 470 nm of 90% or more;

(21) the curable resin composition according to any one of the above (1) to (20), wherein when the curable resin composition is molded on one surface of a lead frame for light-emitting diodes to form a package, a warpage of the package is at most ±1.0 mm;

(22) the curable resin composition according to any one of the above (1) to (21), for use in a semiconductor package;

(23) a curable resin composition tablet including the curable resin composition according to any one of the above (1) to (22) that contains (F) a white pigment as an essential component, wherein at least one of the component (A) and the component (B) is a liquid having a viscosity of at most 50 Pa·s at a temperature of 23° C., the component (E) and the component (F) are contained in a total amount of 70% to 95% by weight, and particles having a size of 12 μm or less account for 40% by volume or more of the total of the component (E) and the component (F);

(24) a molded article formed by curing the curable resin composition according to any one of the above (1) to (21), wherein a surface of the molded article has a light reflectance at a wavelength of 470 nm of 90% or more;

(25) a semiconductor package formed by molding the curable resin composition according to the above (22);

(26) a semiconductor package formed by integrally molding the curable resin composition according to the above (22) and a metal;

(27) the semiconductor package according to the above (25) or (26), wherein the curable resin composition and a lead frame are integrally molded by transfer molding;

(28) the semiconductor package according to any one of the above (25) to (27), wherein the semiconductor package substantially includes a metal and a resin formed on one surface of the metal;

(29) a semiconductor package formed by transfer molding the curable resin composition according to the above (22);

(30) a semiconductor component produced by using the semiconductor package according to any one of the above (25) to (29); and

(31) a light-emitting diode produced by using the semiconductor package according to any one of the above (25) to (29).

Advantageous Effects of Invention

The curable resin composition of the present invention provides a curable resin composition which gives a cured product having a low linear expansion coefficient. Therefore, provided are a semiconductor package which is produced by integrally molding the curable resin composition and a metal and has reduced warpage, and a semiconductor produced by using the semiconductor package.

DESCRIPTION OF EMBODIMENTS

Figure 1:
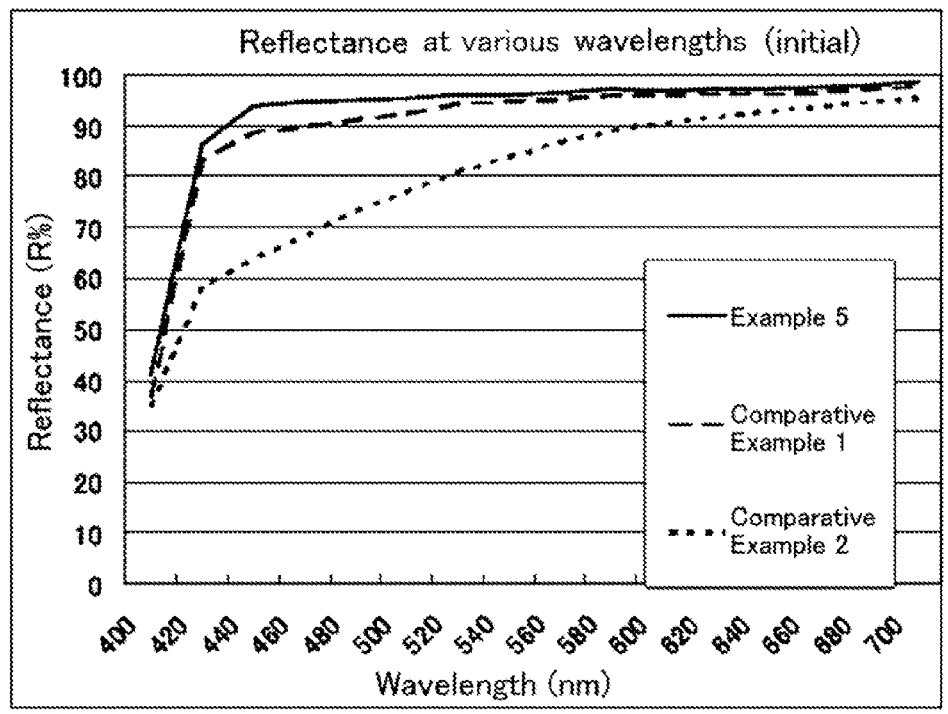
FIG. 1 is a diagram showing initial reflectances at various wavelengths.

Hereinafter, the present invention will be described in detail.

The curable resin composition of the present invention contains, as essential components, (A) an organic compound having at least two carbon-carbon double bonds reactive with SiH groups per molecule, (B) a compound containing at least two SiH groups per molecule, (C) a hydrosilylation catalyst, (D) a silicone compound having at least one carbon-carbon double bond reactive with a SiH group per molecule, and (E) an inorganic filler.

The components are explained below.
(Component (A))

The component (A) is not particularly limited, as long as it is an organic compound having at least two carbon-carbon double bonds reactive with SiH groups per molecule.
(Skeleton of Component (A))

Preferably, the organic compound is not a compound containing a siloxane unit (Si—O—Si) such as polysiloxane-organic block copolymers and polysiloxane-organic graft copolymers, and does not contain elements other than C, H, N, O, S, and halogens as constituent elements.

Compounds containing a siloxane unit disadvantageously tend to lead to low adhesion of the semiconductor package to a lead frame or a sealing resin.

Organic compounds as the component (A) are classified into organic polymeric compounds and organic monomeric compounds.
(Examples of Polymeric Component (A))

Examples of the component (A) which is an organic polymer include organic polymeric compounds having a polyether skeleton, a polyester skeleton, a polyarylate skeleton, a polycarbonate skeleton, a saturated hydrocarbon skeleton, a unsaturated hydrocarbon skeleton, a polyacrylic acid ester skeleton, a polyamide skeleton, a phenol-formaldehyde (phenol resin) skeleton, and a polyimide skeleton.

Specifically, examples of the polyether polymer include polyoxyethylene, polyoxypropylene, polyoxytetramethylene, and polyoxyethylene-polyoxypropylene copolymers. More specific examples thereof include compounds represented by the following formula:

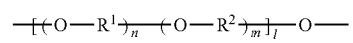

wherein $R^1$ and $R^2$ each represent a C1 to C6 bivalent organic group not containing elements other than C, H, N, O, S, and halogens as constituent elements; and n, m, and l each represent a number of 1 to 300.

Examples of other polymers include polyester polymers obtained by condensation of a dibasic acid such as adipic acid, phthalic acid, isophthalic acid, terephthalic acid, and hexahydrophthalic acid, and a glycol such as ethylene glycol, diethylene glycol, propylene glycol, tetramethylene glycol, and neopentyl glycol, or by ring-opening polymerization of lactones; ethylene-propylene copolymers, polyisobutylene, copolymers of isobutylene and isoprene or the like, polychloroprene, polyisoprene, copolymers of isoprene and butadiene, acrylonitrile, styrene or the like, polybutadiene, copolymers of butadiene and styrene, acrylonitrile or the like, polyisoprene, polybutadiene, polyolefin polymers (saturated hydrocarbon polymers) obtained by hydrogenation of copolymers of isoprene or butadiene and acrylonitrile, styrene or the like; polyacrylic acid esters obtained by radical polymerization of monomers such as ethyl acrylate and butyl acrylate; acrylic acid ester copolymers of an acrylic acid ester such as ethyl acrylate and butyl acrylate and vinyl acetate, acrylonitrile, methyl metacrylate, styrene or the like; graft polymers obtained by polymerization of vinyl monomers in the presence of the above organic polymers; polysulfide polymers, polyamide polymers such as nylon 6 produced by ring-opening polymerization of ε-aminocaprolactam, nylon 66 produced by polycondensation of hexamethylenediamine and adipic acid, nylon 610 produced by polycondensation of hexamethylenediamine and sebacic acid, nylon 11 produced by polycondensation of ε-aminoundecanoic acid, nylon 12 produced by ring-opening polymerization of ε-aminolaurolactam, and copolymer nylons derived from two or more kinds of the aforementioned nylons; polycarbonate polymers produced by, for example, polycondensation of bisphenol A and carbonyl chloride; diallyl phthalate polymers; and polymers having a phenol-formaldehyde (phenol resin) skeleton such as novolac phenol resin, resol phenol resin, ammonia-resol phenol resin, and benzylic ether phenol resin.

The component (A) can be prepared by introducing an alkenyl group having a carbon-carbon double bond into any of the polymer skeletons.

In this case, the alkenyl group having a carbon-carbon double bond may be located at any part of the molecule but is preferably located at a side chain or at a terminal in view of reactivity.

Various proposed methods may be employed for introducing an alkenyl group into the polymer skeleton. Such methods are classified roughly into methods of introducing an alkenyl group after polymerization and methods of introducing an alkenyl group during polymerization.

For example, the methods of introducing an alkenyl group after polymerization include allowing an organic polymer containing a functional group such as a hydroxyl group, an alkoxide group, a carboxyl group, and an epoxy group at a terminal, a main chain, or a side chain to react with an organic compound containing both an active group reactive with the functional group and an alkenyl group so that the alkenyl group is introduced into the terminal, main chain, or side chain. Examples of the organic compound having both an active group reactive with the functional group and an alkenyl group include C3-C20 unsaturated fatty acids, acid halides, acid anhydrides and the like, such as acrylic acid, methacrylic acid, vinyl acetate, acrylic acid chloride, and acrylic acid bromide; C3-C20 unsaturated aliphatic alcohol-substituted carbonic acid halides such as allyl chloroformate ($CH_2=CHCH_2OCOCl$) and allyl bromoformate ($CH_2=CHCH_2OCOBr$); allyl chloride, allyl bromide, vinyl (chloromethyl)benzene, allyl(chloromethyl)benzene, allyl (bromomethyl)benzene, allyl(chloromethyl)ether, allyl (chloromethoxy)benzene, 1-butenyl(chloromethyl)ether, 1-hexenyl(chloromethoxy)benzene, allyloxy(chloromethyl) benzene, and allyl isocyanate.

Moreover, a method of introducing an alkenyl group by transesterification may be employed. This method includes transesterifying an alcohol residue in an ester moiety of a polyester resin or acrylic resin with an alkenyl-containing alcohol or an alkenyl-containing phenol derivative in the presence of a transesterification catalyst. The alkenyl-containing alcohol or alkenyl-containing phenol derivative to be used for transesterification of the alcohol residue is not limited as long as it is an alcohol or phenol derivative that has at least one alkenyl group and at least one hydroxyl group, preferably one hydroxyl group. Although the catalyst is not necessarily used, titanium catalysts and tin catalysts are preferred.

Examples of such a compound include vinyl alcohol, allyl alcohol, 3-buten-1-ol, 4-penten-1-ol, 5-hexen-1-ol, 6-hepten-1-ol, 7-octen-1-ol, 8-nonen-1-ol, 9-decen-1-ol, 2-(allyloxy)ethanol, neopentyl glycol monoallyl ether, glycerol diallyl ether, trimethylol propane triallyl ether, trimethylol ethane triallyl ether, pentaerythritol tetraallyl ether, 1,2,6-hexanetriol triallyl ether, sorbitan triallyl ether, and compounds represented by the following formulae:

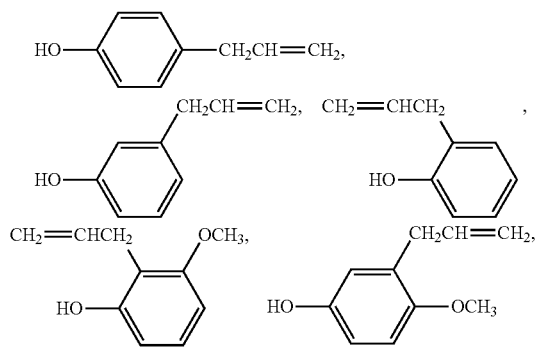

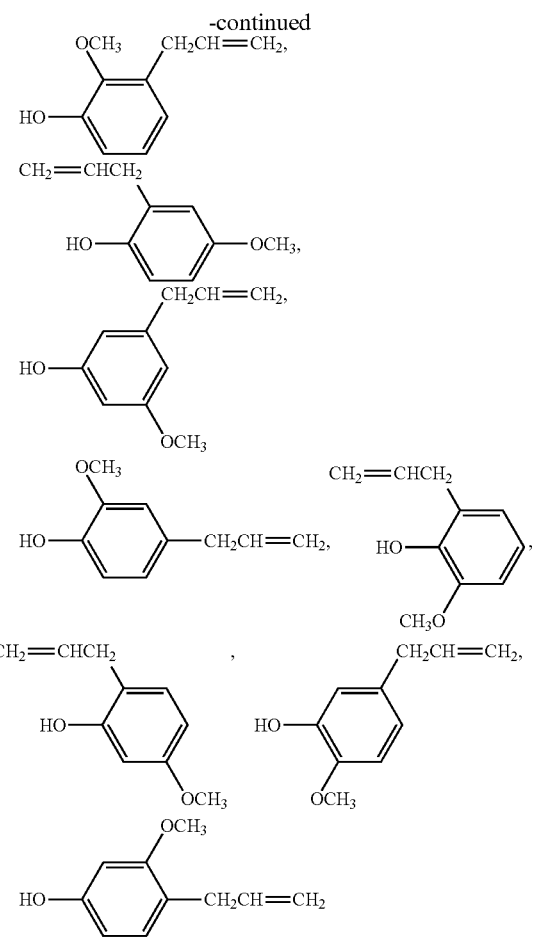

and the like. In view of easy availability, among the above examples, allyl alcohol, vinyl alcohol, 3-buten-1-ol, 2-(allyloxy)ethanol, and compounds represented by the following formulae:

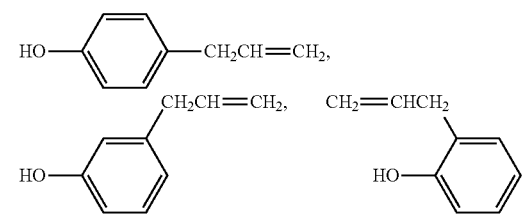

are preferred.

Moreover, another method of introducing an alkenyl group may be mentioned in which an ester moiety of a polyester resin or acrylic resin is transesterified with an esterified product (e.g. an acetic acid ester) of the above alcohol or phenol derivative in the presence of a transesterification catalyst, while a generated low molecular weight esterified product (e.g. an acetic acid ester) of the alcohol residue in the ester moiety of the polyester resin or acrylic resin is removed outside the system by vacuum distillation or the like.

Furthermore, it is also possible to introduce an alkenyl group into the terminal by a method including living polymerization of methyl(meth)acrylate or the like and subsequent termination of the living terminal with a compound containing an alkenyl group.

Examples of the method of introducing an alkenyl group during polymerization include, in the case of producing an organic polymer skeleton of the component (A) used in the present invention by radical polymerization, introduction of an alkenyl group into a side chain or a terminal of the organic polymer skeleton by using a vinyl monomer that contains an alkenyl group having low radical reactivity in the molecule, such as allyl methacrylate and allyl acrylate, or a radical chain transfer agent that contains an alkenyl group having low radical reactivity, such as allyl mercaptan.

The component (A) preferably has any molecular weight in the range of 100 to 100,000 although the molecular weight is not particularly limited. In the case where the component (A) is an organic polymer containing an alkenyl group, the molecular weight is particularly preferably in the range of 500 to 20,000. The molecular weight of 500 or less is less likely to lead to characteristics resulting from the use of an organic polymer, such as imparting of flexibility. The molecular weight of 100,000 or more is less likely to lead to an effect of crosslinking by a reaction between an alkenyl group and a SiH group.

(Examples of Monomeric Component (A))

Examples of the component (A) which is an organic monomer include phenol compounds, bisphenol compounds, aromatic hydrocarbon compounds such as benzene and naphthalene; aliphatic hydrocarbon compounds (e.g. linear, alicyclic compounds); heterocyclic compounds; and mixtures thereof.

(Carbon-Carbon Double Bond in Component (A))

The bonding sites of the carbon-carbon double bonds reactive with SiH groups are not particularly limited, and may be located at any part of the molecule.

The carbon-carbon double bonds reactive with SiH groups in the component (A) are not particularly limited, and groups represented by the following formula (I):

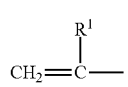

(I)

(wherein $R^1$ represents a hydrogen atom or a methyl group) are preferred in view of reactivity. In view of easy availability of materials, groups represented by the following formula:

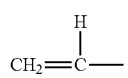

are particularly preferred.

Preferred examples of the carbon-carbon double bonds reactive with SiH groups in the component (A) include alicyclic groups represented by the following formula (II):

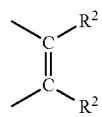

(II)

(wherein $R^2$ represents a hydrogen atom or a methyl group) in terms of high thermal resistance of the cured product. Moreover, in view of easy availability of materials, alicyclic groups represented by the following formula:

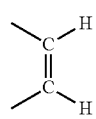

are particularly preferred.

(Bonding Group Between Carbon-Carbon Double Bond and Skeleton in Component (A))

The carbon-carbon double bonds reactive with SiH groups may be directly bonded to a skeletal portion of the component (A), or may be covalently bonded thereto via a bivalent or higher valent substituent. The bivalent or higher valent substituent is not particularly limited as long as the substituent has a carbon number of 0 to 10. Preferably, the substituent does not contain elements other than C, H, N, O, S, and halogens as constituent elements. As examples of such a substituent, those represented by the following formulae:

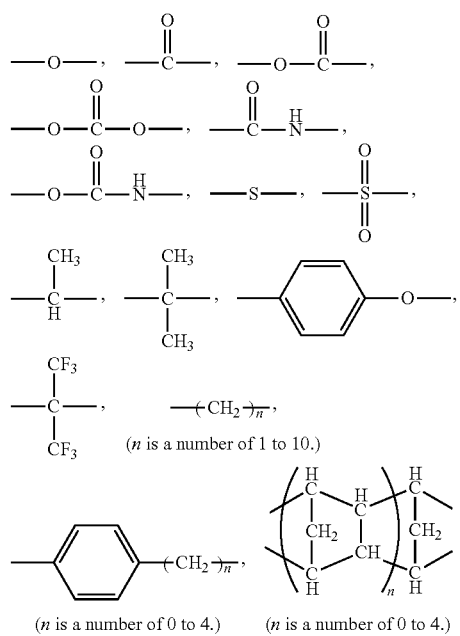

may be mentioned. Moreover, two or more of these bivalent or higher valent substituents may be covalently bonded to form one bivalent or higher valent substituent.

As the group to be covalently bonded to the skeletal portion mentioned above, specifically, a vinyl group, allyl group, methallyl group, acryl group, methacryl group, 2-hydroxy-3-(allyloxy)propyl group, 2-allylphenyl group, 3-allylphenyl group, 4-allylphenyl group, 2-(allyloxy)phenyl group, 3-(allyloxy)phenyl group, 4-(allyloxy)phenyl group, 2-(allyloxy)ethyl group, 2,2-bis(allyloxymethyl)butyl group, 3-allyloxy-2,2-bis(allyloxymethyl)propyl group, and groups represented by the following formulae:

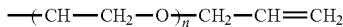

(n is a number satisfying 5≥n≥2.),

(R is a bivalent group selected from

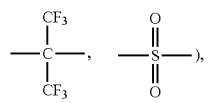

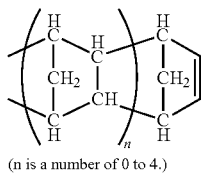

(n is a number of 0 to 4.)

may be mentioned.
(Specific Examples of Component (A))
Specific examples of the organic polymeric component (A) include 1,2-polybutadiene (with a 1.2 ratio of 10% to 100%, preferably of 50% to 1000), allyl ether of novolac phenol, allylated polyphenylene oxide, and those represented by the following formulae:

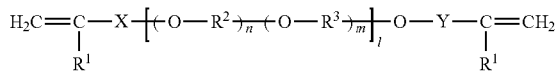

wherein $R^1$ represents H or $CH_3$; $R^2$ and $R^3$ each represent a C1 to C6 bivalent organic group not containing elements other than C, H, N, O, S, and halogens as constituent elements; X and Y each represent a C0 to C10 bivalent substituent; and n, m, and l each represent a number of 1 to 300,

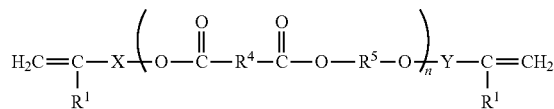

wherein $R^1$ represents H or $CH_3$; $R^4$ and $R^5$ each represent a C1 to C6 bivalent organic group; X and Y each represent a C0 to C10 bivalent substituent; and n, m, and l each represent a number of 1 to 300,

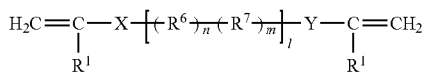

wherein $R^1$ represents H or $CH_3$; $R^6$ and $R^7$ each represent a C1 to C20 bivalent organic group; X and Y each represent a C0 to C10 bivalent substituent; and n, m, and l each represent a number of 1 to 300,

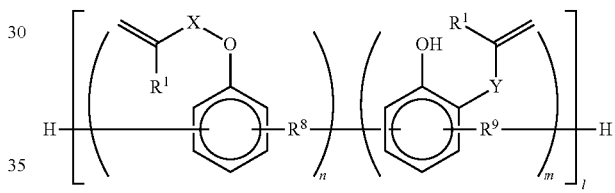

wherein $R^1$ represents H or $CH_3$; $R^8$ and $R^9$ each represent a C1 to C6 bivalent organic group; X and Y each represent a C0 to C10 bivalent substituent; and n, m, and l each represent a number of 1 to 300,

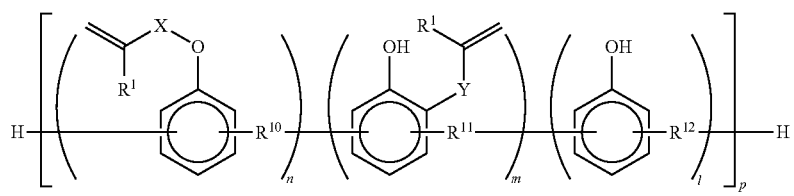

wherein $R^1$ represents H or $CH_3$; $R^{10}$, $R^{11}$, and $R^{12}$ each represent a C1 to C6 bivalent organic group; X and Y each represent a C0 to C10 bivalent substituent; and n, m, l, and p each represent a number of 1 to 300.
Specific examples of the organic monomeric component (A) include diallyl phthalate, triallyl trimellitate, diethylene glycol bisallyl carbonate, trimethylolpropane diallyl ether, pentaerythritol triallyl ether, 1,1,2,2-tetraallyloxyethane, diallylidenepentaerythritol, triallyl cyanurate, triallyl isocyanurate, 1,2,4-trivinylcyclohexane, divinylbenzenes (with a purity of 50 to 100%, preferably of 80 to 100%), divinylbiphenyl, 1,3-diisopropenylbenzene, 1,4-diisopropenylbenzene, and oligomers thereof, and compounds represented by the following formulae:

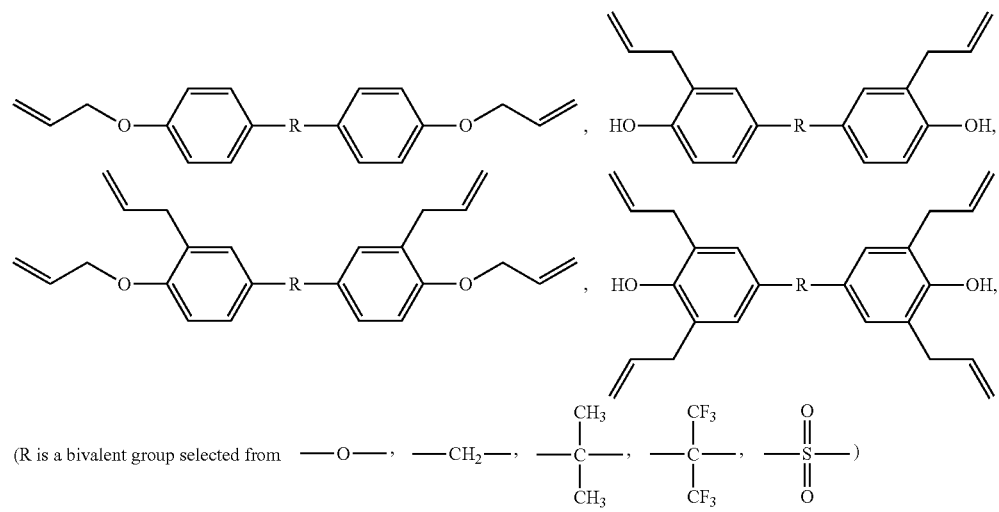
(R is a bivalent group selected from —O—, —CH$_2$—, —C(CH$_3$)$_2$—, —C(CF$_3$)$_2$—, —S(O)$_2$—)
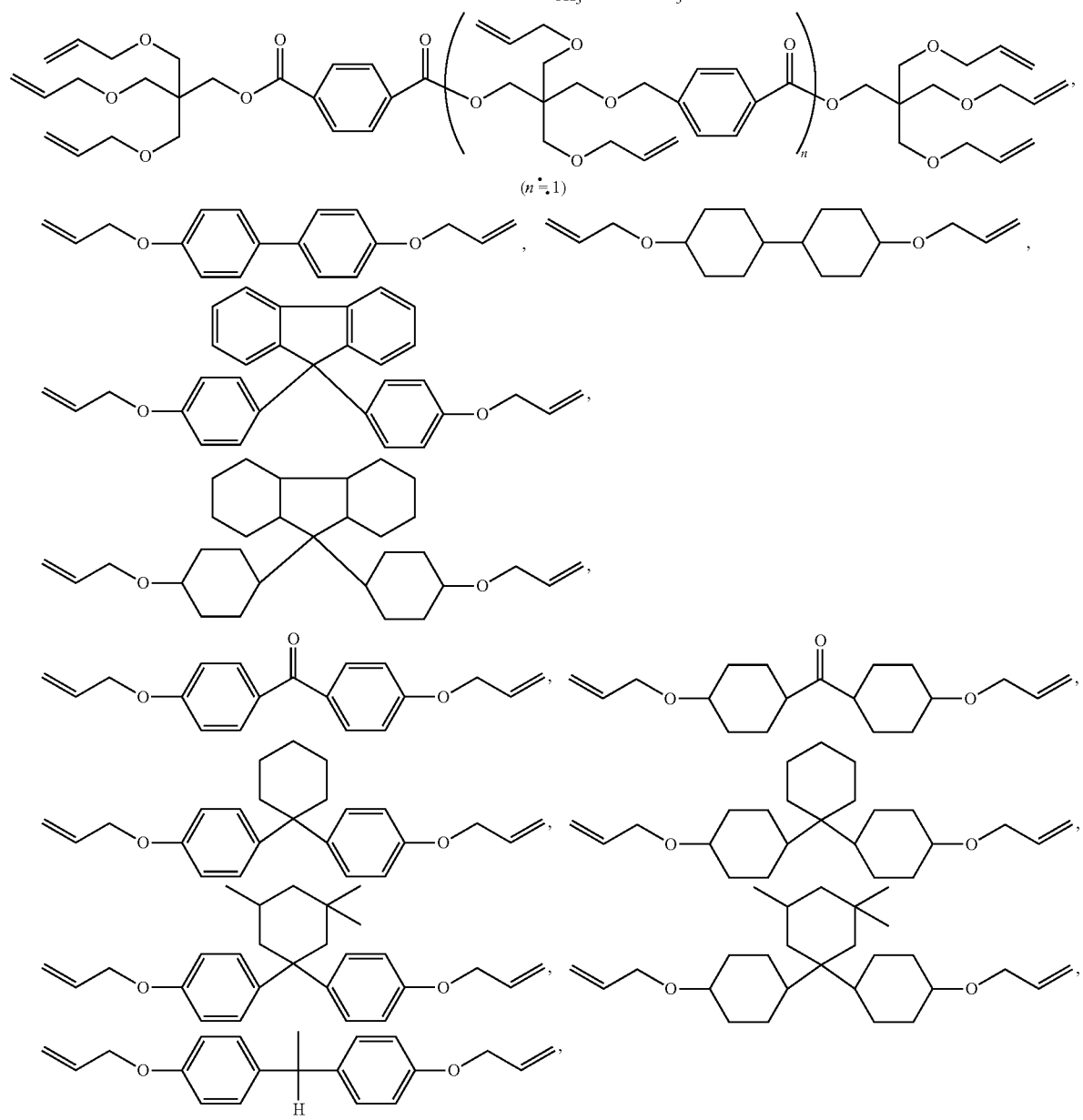

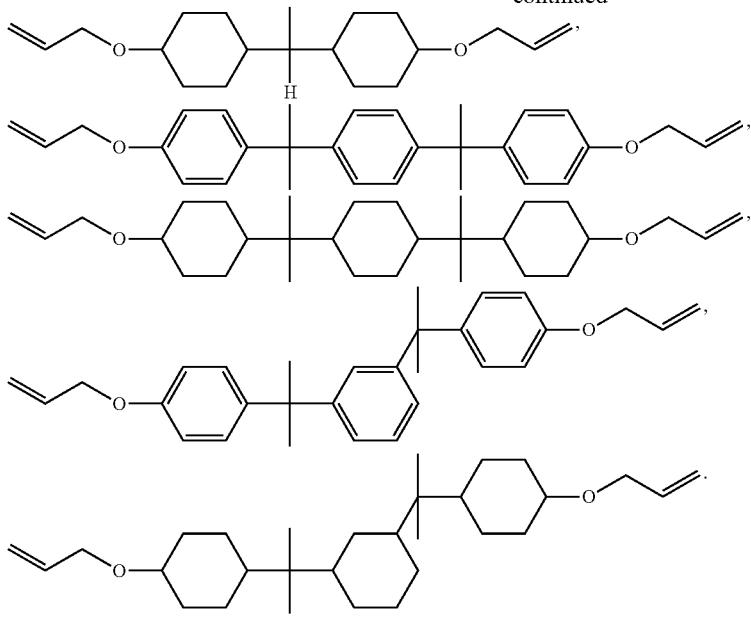

Moreover, compounds obtained by allyl group substitution for part or all of glycidyl groups in known epoxy resin, and the like may also be mentioned.

Also usable as the component (A) are low molecular weight compounds which are difficult to express dividedly in terms of the skeletal portion and alkenyl groups as described above. Specific examples of the low molecular weight compounds include aliphatic acyclic polyene compounds such as butadiene, isoprene, octadiene and decadiene; alicyclic polyene compounds such as cyclopentadiene, cyclohexadiene, cyclooctadiene, dicyclopentadiene, tricyclopentadiene and norbornadiene; substituted alicyclic olefin compounds such as vinylcyclopentene and vinylcyclohexene, and the like.

(Preferred Requirements for Component (A))

In view of the possibility of further improvement in thermal resistance, the component (A) preferably has carbon-carbon double bonds reactive with SiH groups in an amount of not less than 0.001 mol, more preferably not less than 0.005 mol, and still more preferably not less than 0.008 mol, per gram of the component (A).

The number of carbon-carbon double bonds reactive with SiH groups in the component (A) is not limited as long as the number is at least two per molecule on average. For achieving further improvement in mechanical strength, the number is preferably more than two, and more preferably not less than three. If the number of carbon-carbon double bonds reactive with SiH groups in the component (A) is one or less per molecule, the component (A), after the reaction with the component (B), only gives a graft structure and fails to give a crosslinked structure.

In view of good reactivity, the component (A) preferably contains at least one vinyl group, and more preferably at least two vinyl groups, per molecule. It preferably contains at most six vinyl groups, and more preferably at most four vinyl groups, per molecule because the storage stability then tends to be better.

In view of high mechanical thermal resistance, of less stringiness, good moldability and handleability of the material liquid, of easy homogeneous mixing with powders such as the component (E) and the component (F), and of good moldability in the form of curable resin composition tablets, the component (A) preferably has a molecular weight of less than 900, more preferably less than 700, and still more preferably less than 500.

In order to achieve homogeneous mixing with other components and good workability, the component (A) preferably has a viscosity of lower than 1000 poise, more preferably lower than 300 poise, and still more preferably lower than 30 poise, at a temperature of 23° C. The viscosity can be determined using an E-type viscometer.

In view of higher light resistance, the component (A) is preferably low in the amount of compounds containing a phenolic hydroxyl group and/or a derivative of a phenolic hydroxyl group, and is more preferably free from compounds containing a phenolic hydroxyl group and/or a derivative of a phenolic hydroxyl group. The term "phenolic hydroxyl group" herein means a hydroxyl group directly bound to an aromatic hydrocarbon nucleus such as, for example, a benzene ring, a naphthalene ring or an anthracene ring. The term "derivative of a phenolic hydroxyl group" means a group resulting from substitution of the hydrogen atom of the phenolic hydroxyl group with an alkyl group (e.g. a methyl group, an ethyl group), an alkenyl group (e.g. a vinyl group, an allyl group), an acyl group (e.g. an acetoxy group), or the like.

In view of particularly good light resistance, the weight ratio of aromatic rings in the component (A) is preferably not more than 50% by weight, more preferably not more than 40% by weight, and still more preferably not more than 30% by weight. Most preferably, the component (A) does not contain any aromatic hydrocarbon ring.

In view of less coloring and high light resistance of a cured product to be obtained, the component (A) is preferably vinylcyclohexene, dicyclopentadiene, vinyl norbornene, triallyl isocyanurate, diallyl ether of 2,2-bis(4-hydroxycyclohexyl)propane, or 1,2,4-trivinylcyclohexane, and is particularly preferably triallyl isocyanurate, diallyl ether of 2,2-bis(4-hydroxycyclohexyl)propane, or 1,2,4-trivinylcyclohexane.

(Preferred Structure 1 of Component (A))

In view of particularly high thermal resistance and light resistance, the component (A) is preferably a compound represented by the following formula (III):

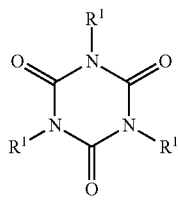
(III)

wherein R$^1$s each represent a monovalent organic group containing 1 to 50 carbon atoms, and they may be the same or different from one another.

In view of higher thermal resistance of a cured product to be obtained, R$^1$s in the formula (III) each are preferably a monovalent organic group containing 1 to 20 carbon atoms, more preferably a monovalent organic group containing 1 to 10 carbon atoms, and still more preferably a monovalent organic group containing 1 to 4 carbon atoms. As preferred examples of these R$^1$s, a methyl group, ethyl group, propyl group, butyl group, phenyl group, benzyl group, phenethyl group, vinyl group, allyl group, glycidyl group, and groups of the following formulae:

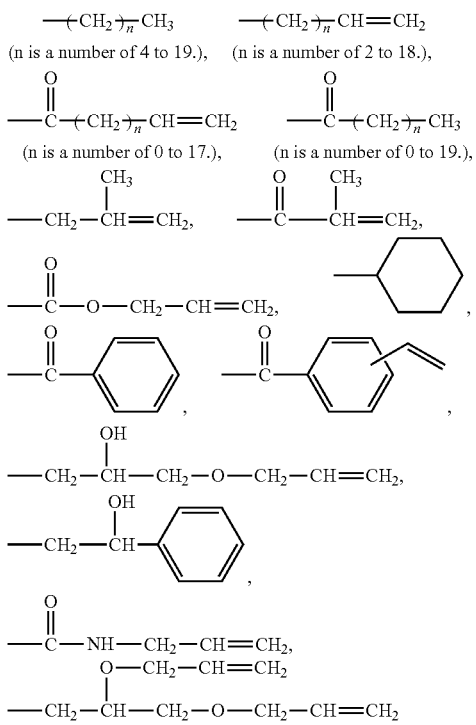

and the like are mentioned.

In view of the possibility of good adhesion of the package to a lead frame or a sealing agent, or of the possibility of high mechanical strength of the resulting package, at least one of the three R$^1$s is preferably a monovalent C1-C50 organic group containing at least one epoxy group, and is more preferably a monovalent C1-C50 organic group containing at least one epoxy group represented by the following formula.

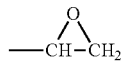

Preferred examples of such R$^1$s include a glycidyl group, and groups represented by the following formulae:

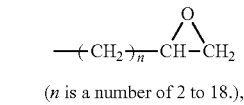 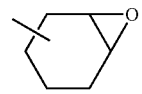

($n$ is a number of 2 to 18.), and the like.

In view of the possibility of good heat resistance of a cured product to be obtained, R$^1$s in the formula (III) each are preferably a monovalent C1-C50 organic group having at most two oxygen atoms and containing exclusively C, H, and O as constituent elements, and more preferably a monovalent C1-C50 hydrocarbon group. Preferred examples of these R$^1$s include a methyl group, ethyl group, propyl group, butyl group, phenyl group, benzyl group, phenethyl group, vinyl group, allyl group, glycidyl group, and groups represented by the following formulae:

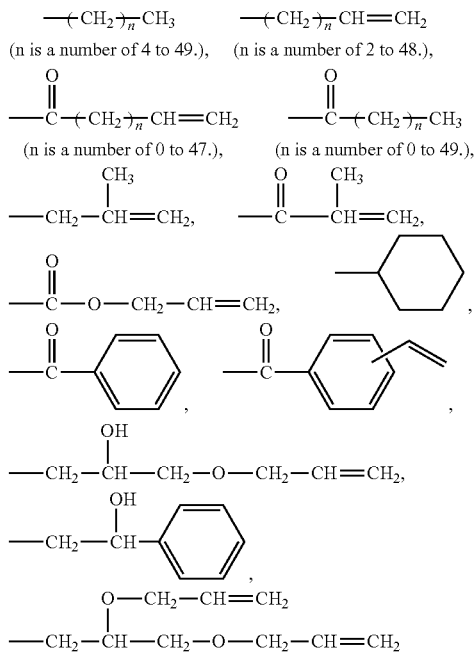

and the like.

In view of good reactivity, at least one of the three R$^1$s in the formula (III) is preferably a monovalent C1-C50 organic group containing at least one group represented by the following formula:

and is more preferably a monovalent C1-C50 organic group containing at least one group represented by the following formula (IV):

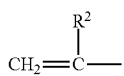 (IV)

wherein $R^2$ represents a hydrogen atom or a methyl group. Still more preferred are organic compounds in which at least two of the three $R^1$s are represented by the following formula (V):

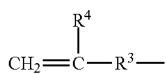 (V)

(wherein $R^3$ represents a direct bond or a bivalent organic group having 1 to 48 carbon atoms, and $R^4$ represents a hydrogen atom or a methyl group), a plurality of $R^3$s may be the same or different, and a plurality of $R^4$s may be the same or different.

$R^3$ in the formula (V) is a direct bond or a bivalent organic group having 1 to 48 carbon atoms. In view of higher thermal resistance of a package to be obtained, the $R^3$ is preferably a direct bond or a bivalent organic group having 1 to 20 carbon atoms, more preferably a direct bond or a bivalent organic group having 1 to 10 carbon atoms, and still more preferably a direct bond or a bivalent organic group having 1 to 4 carbon atoms. Preferred examples of such $R^3$ include groups represented by the following formulae:

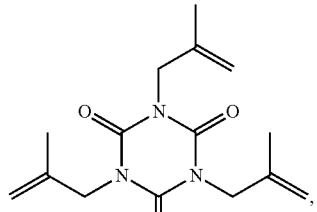

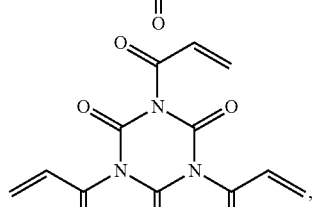

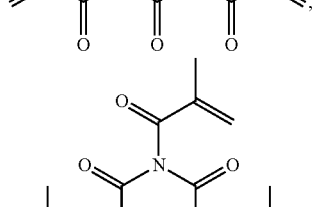

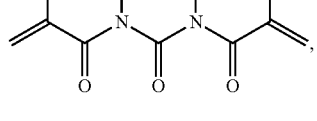

and the like.

In view of the possibility of good thermal resistance of a package to be obtained, $R^3$ in the formula (V) is preferably a direct bond, or a bivalent C1-C48 organic group having at most two oxygen atoms and containing exclusively C, H, and O as constituent elements. More preferably, the $R^3$ is a direct bond, or a bivalent C1-C48 hydrocarbon group. Preferred examples of such $R^3$ include groups represented by the following formulae:

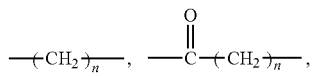

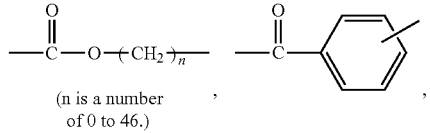

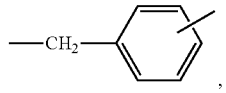

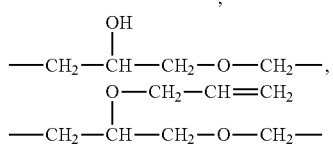

and the like.

$R^4$ in the formula (V) is a hydrogen atom or a methyl group. In view of good reactivity, the $R^4$ is preferably a hydrogen atom.

However, the preferred examples of the organic compound represented by the formula (III) each need to have at least two carbon-carbon double bonds reactive with SiH groups per molecule. In view of the possibility of further improvement in thermal resistance, more preferred are organic compounds having at least three carbon-carbon double bonds reactive with SiH groups per molecule.

Preferred specific examples of such organic compounds represented by the formula (III) include triallyl isocyanurate, and compounds represented by the following formulae:

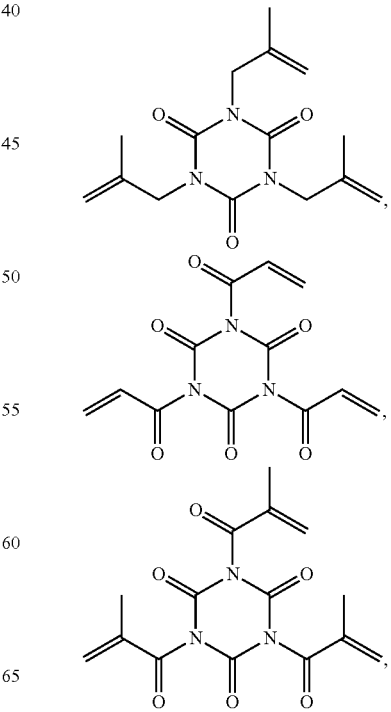

-continued

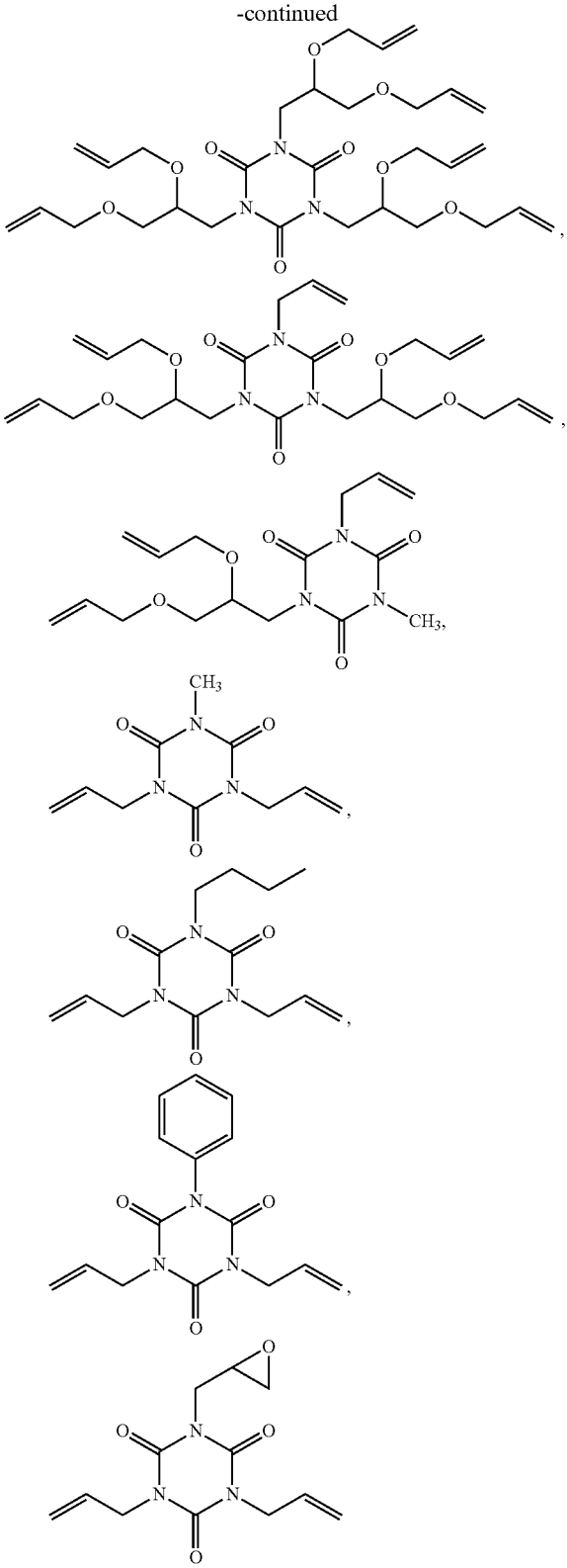

and the like.
(Preferred Structure 2 of Component (A))

In view of good compatibility with the component (B), and of low volatility of the component (A) leading to less possibility of causing outgassing from a package to be obtained, reaction products of one or more kinds of compounds selected from the organic compounds having at least two carbon-carbon double bonds reactive with SiH groups per molecule as mentioned as examples of the component (A), with a compound (β) containing a SiH group are also preferred.

(Component (β))

The component (β) is a compound containing a SiH group, and examples thereof include acyclic and/or cyclic polyorganosiloxanes containing a SiH group.

Specific examples thereof include compounds represented by the following formulae:

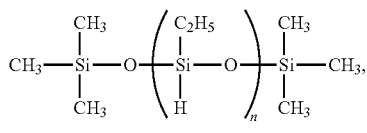

($n = 3 \sim 1000$)

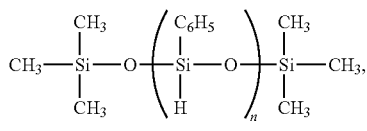

($n = 3 \sim 1000$)

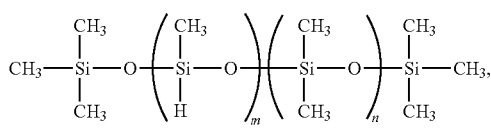

($m = 3 \sim 1000, n = 0 \sim 1000$)

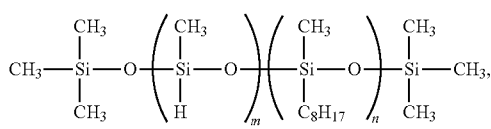

($m = 3 \sim 1000, n = 0 \sim 1000$)

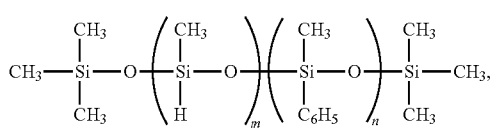

($m = 3 \sim 1000, n = 0 \sim 1000$)

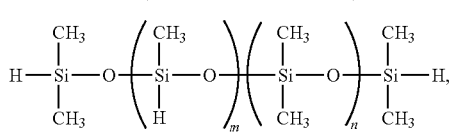

($m = 1 \sim 1000, n = 0 \sim 1000$)

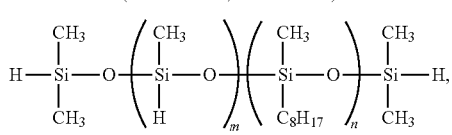

($m = 1 \sim 1000, n = 0 \sim 1000$)

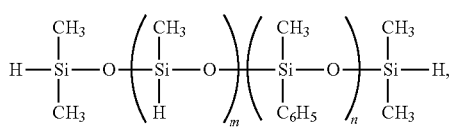

($m = 1 \sim 1000, n = 0 \sim 1000$)

-continued

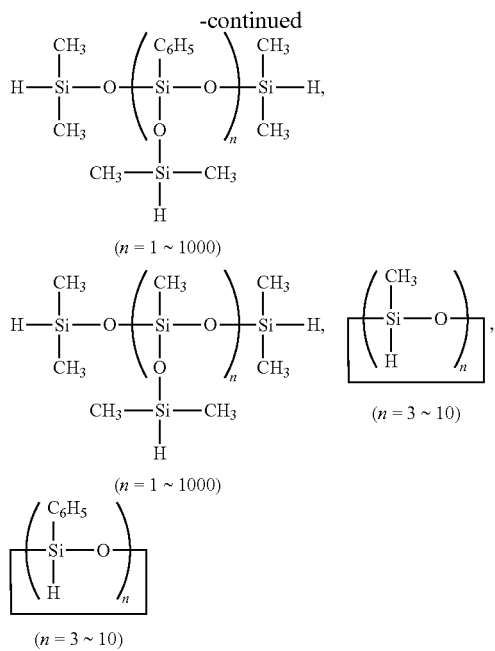

and the like.

In view of better compatibility with the organic compounds having at least two carbon-carbon double bonds reactive with SiH groups per molecule, the component (β) is preferably a cyclic polyorganosiloxane containing at least three SiH groups per molecule, represented by the following formula (VI):

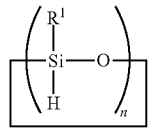

(VI)

wherein $R^1$ represents an organic group having 1 to 6 carbon atoms, and n represents a number of 3 to 10.

The substituent $R^1$ in the compound represented by the formula (VI) preferably does not contain constituent elements other than C, H, and O. The $R^1$ is more preferably a hydrocarbon group, and still more preferably a methyl group.

In view of easy availability and the like, 1,3,5,7-tetramethylcyclotetrasiloxane is preferred.

Other examples of the component (β) include compounds containing a SiH group, such as bisdimethylsilylbenzene.

The components (β) as mentioned above may be used alone, or two or more kinds thereof may be used in admixture.

(Reaction Between Organic Compound Having at Least Two Carbon-Carbon Double Bonds Reactive with SiH Groups Per Molecule, and Component (β))

The following description will discuss a hydrosilylation reaction between the organic compound having at least two carbon-carbon double bonds reactive with SiH groups per molecule and the component (β) in the case where a compound obtainable by a hydrosilylation reaction between the organic compound having at least two carbon-carbon double bonds reactive with SiH groups per molecule and the component (β) is used as the component (A) in the present invention.

Here, the hydrosilylation reaction between the organic compound having at least two carbon-carbon double bonds reactive with SiH groups per molecule and the component (β) may give a mixture of a plurality of compounds including the component (A) in the present invention. In this case, the curable resin composition of the present invention can be prepared by using the mixture as it is without separating the component (A).

In the case of subjecting the organic compound having at least two carbon-carbon double bonds reactive with SiH groups per molecule and the component (β) to a hydrosilylation reaction, the mixing ratio of the organic compound having at least two carbon-carbon double bonds reactive with SiH groups per molecule and the component (β) is not particularly limited. Because gelation during the reaction can be suppressed, generally, the total number (X) of carbon-carbon double bonds reactive with SiH groups in the organic compound having at least two carbon-carbon double bonds reactive with SiH groups per molecule to be mixed, and the total number (Y) of SiH groups in the component (β) to be mixed preferably satisfy the ratio: X/Y≥2, and more preferably satisfy the ratio: X/Y≥3. In view of better compatibility between the component (A) and the component (B), the X and Y preferably satisfy the ratio: 10≥X/Y, and more preferably satisfy the ratio: 5≥X/Y.

In the case of subjecting the organic compound having at least two carbon-carbon double bonds reactive with SiH groups per molecule and the component (β) to a hydrosilylation reaction, an appropriate catalyst may be used. The following may be used as the catalyst: a simple substance of platinum; solid platinum supported by a carrier such as alumina, silica, and carbon black; chloroplatinic acid; complexes of chloroplatinic acid with an alcohol, aldehyde, ketone, or the like; platinum-olefin complexes (e.g., $Pt(CH_2=CH_2)_2(PPh_3)_2$, $Pt(CH_2=CH_2)_2Cl_2$), platinum-vinylsiloxane complexes (e.g., $Pt(ViMe_2SiOSiMe_2Vi)_n$, $Pt[(MeViSiO)_4]_m$), platinum-phosphine complexes (e.g., $Pt(PPh_3)_4$, $Pt(PBu_3)_4$), platinum-phosphite complexes (e.g., $Pt[P(OPh)_3]_4$, $Pt[P(OBu)_3]_4$) (in those formulae, Me is a methyl group, Bu is a butyl group, Vi is a vinyl group, Ph is a phenyl group, and n and m are integers); dicarbonyldichloroplatinum; Karstedt catalysts; platinum-hydrocarbon complexes described in Ashby's U.S. Pat. Nos. 3,159,601 and 3,159,662; and platinum alcoholate catalysts described in Lamoreaux's U.S. Pat. No. 3,220,972. In addition, platinum chloride-olefin complexes described in Modic's U.S. Pat. No. 3,516,946 are also usable in the present invention.

Other examples of the catalyst except platinum compounds include $RhCl(PPh_3)_3$, $RhCl_3$, $RhAl_2O_3$, $RuCl_3$, $IrCl_3$, $FeCl_3$, $PdCl_2 \cdot 2H_2O$, $NiCl_2$, and $TiCl_4$.

In view of catalytic activity, chloroplatinic acid, platinum-olefin complexes, platinum-vinylsiloxane complexes, and the like are preferred among the above examples. These catalysts may be used alone, or two or more kinds thereof may be used in combination.

The amount of the catalyst added is not particularly limited. For achieving sufficient curing and keeping the costs of the curable resin composition relatively low, the minimum amount is preferably $10^{-8}$ mol, and more preferably $10^{-6}$ mol, per mol of SiH groups in the component (β). The maximum amount is preferably $10^{-1}$ mol, and more preferably $10^{-2}$ mol, per mol of SiH groups in the component (β).

A promoter may be used along with the catalyst. Examples of the promoter include phosphorus compounds such as triphenylphosphine; 1,2-diester compounds such as dimethyl maleate; acetylene alcohol compounds such as 2-hydroxy-2-methyl-1-butyne; sulfur compounds such as a simple substance of sulfur; and amine compounds such as triethylamine. The amount of the promoter added is not particularly limited, but the minimum amount is preferably $10^{-2}$ mol, and more preferably $10^{-1}$ mol, and the maximum amount is preferably $10^{-2}$ mol, and more preferably 10 mol, per mol of the hydrosilylation catalyst.

Various methods may be employed for mixing the organic compound having at least two carbon-carbon double bonds reactive with SiH groups per molecule, the component (β), and the catalyst for reaction. Preferred is a method of preliminarily mixing the organic compound having at least two carbon-carbon double bonds reactive with SiH groups per molecule with the catalyst, and then mixing the mixture with the component (β). A method of adding the catalyst to a mixture of the organic compound having at least two carbon-carbon double bonds reactive with SiH groups per molecule and the component (β) leads to difficulty in controlling the reaction. In the case of a method of adding the organic compound having at least two carbon-carbon double bonds reactive with SiH groups per molecule to a mixture of the component (β) and the catalyst, the component (β) may be altered because the component (β) can react with existing moisture in the presence of the catalyst.

Various temperatures may be employed for the reaction. The lower limit of the temperature range is preferably 30° C., and more preferably 50° C., and the upper limit of the temperature range is preferably 200° C., and more preferably 150° C. in the reaction. Low reaction temperatures prolong the time for sufficient reaction, and high reaction temperatures are not practical. The reaction may be performed at a constant temperature, or may be performed while the temperature is changed in multiple steps or continuously as needed.

Various reaction times and various pressures during the reaction may be employed as needed.

A solvent may be used in the hydrosilylation reaction. The usable solvent is not particularly limited as long as it does not inhibit the hydrosilylation reaction. Specifically, suitable examples of the solvent include hydrocarbon solvents such as benzene, toluene, hexane, and heptane; ether solvents such as tetrahydrofuran, 1,4-dioxane, 1,3-dioxolane, and diethyl ether; ketone solvents such as acetone, and methyl ethyl ketone; and halogen solvents such as chloroform, methylene chloride, and 1,2-dichloroethane. A mixed solvent containing two or more solvents may be used as the solvent. Toluene, tetrahydrofuran, 1,3-dioxolane, and chloroform are preferred as the solvent. The amount of the solvent to be used may be appropriately set.

Various other additives may be used in order to, for example, control the reactivity.

After the reaction between the organic compound having at least two carbon-carbon double bonds reactive with SiH groups per molecule and the component (β), the solvent or/and the unreacted organic compound having at least two carbon-carbon double bonds reactive with SiH groups per molecule or/and component (β) may be removed. By removing these volatiles, the resulting component (A) does not contain any volatiles so that problems of voids and cracks caused by volatilization of volatiles are less likely to occur during curing with the component (B). Examples of the removal method include vacuum distillation, and treatment with activated carbon, aluminum silicate, silica gel, or the like. The vacuum distillation is preferably performed at low temperatures. In this case, the upper limit of the temperature is preferably 100° C., and more preferably 60° C. Treatment at high temperatures tends to lead to alteration such as thickening.

Examples of the component (A) that is a reaction product of the organic compound having at least two carbon-carbon double bonds reactive with SiH groups per molecule and the component (β) as mentioned above include a reaction product of bisphenol A diallyl ether and 1,3,5,7-tetramethylcyclotetrasiloxane, a reaction product of vinylcyclohexene and 1,3,5,7-tetramethylcyclotetrasiloxane, a reaction product of divinylbenzene and 1,3,5,7-tetramethylcyclotetrasiloxane, a reaction product of dicyclopentadiene and 1,3,5,7-tetramethylcyclotetrasiloxane, a reaction product of triallyl isocyanurate and 1,3,5,7-tetramethylcyclotetrasiloxane, a reaction product of diallyl monoglycidyl isocyanurate and 1,3,5,7-tetramethylcyclotetrasiloxane, a reaction product of vinyl norbornene and bisdimethylsilylbenzene, and the like.

(Other Reactive Groups in Component (A))

The component (A) may contain other reactive groups. Examples of such reactive groups include an epoxy group, amino group, radical-polymerizable unsaturated groups, carboxyl group, isocyanate group, hydroxyl group, and alkoxysilyl groups. In the case where the component (A) contains such a functional group, the resulting curable resin composition tends to have high adhesion property, and the strength of a cured product to be obtained tends to be high. An epoxy group is preferred among the functional groups in view of the possibility of higher adhesion. In view of higher thermal resistance of a cured product to be obtained, the component (A) preferably contains at least one reactive group per molecule on average.

(Mixing of Component (A))

The component (A) may be used alone, or two or more kinds thereof may be used in admixture.

(Component (B))

The component (B) is a compound containing at least two SiH groups per molecule.

The component (B) is not particularly limited as long as it contains at least two SiH groups per molecule, and usable examples thereof include compounds containing at least two SiH groups per molecule described in WO96/15194.

In view of availability, preferred among these are acyclic and/or cyclic organopolysiloxanes containing at least two SiH groups per molecule. In view of good compatibility with the component (A), further preferred are cyclic polyorganosiloxanes containing at least two SiH groups per molecule, represented by the following formula (VI):

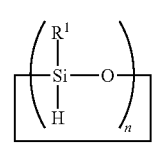

(VI)

wherein $R^1$ represents an organic group having 1 to 6 carbon atoms, and n represents a number of 3 to 10.

The substituent $R^1$ in the compound represented by the formula (VI) is preferably composed of C, H, and O. The substituent $R^1$ is more preferably a hydrocarbon group, and still more preferably a methyl group.

In view of easy availability, the compound represented by the formula (VI) is preferably 1,3,5,7-tetramethylcyclotetrasiloxane.

The molecular weight of the component (B) is not particularly limited, and the component (B) having any molecular weight may be favorably used. In view of better fluidity and easy homogeneous mixing with powders such as the component (E) and the component (F), the component (B) having a low molecular weight is preferably used. In this case, the minimum molecular weight is preferably 50, and the maximum molecular weight is preferably 100,000, more preferably 1,000, and still more preferably 700.

The component (B) is preferably liquid at a temperature of 23° C. for easy homogeneous mixing with other components, especially powders such as the component (E) and the component (F), or more specifically, because of no need to liquefy the component (B) by heating to the melting point or higher for homogeneous mixing. The viscosity at 23° C. of the component (B) is preferably at most 50 Pa·s, more preferably at most 20 Pa·s, and still more preferably at most 5 Pa·s. The viscosity can be measured with an E-type viscometer.

The component (B) may be used alone, or two or more kinds thereof may be used in admixture.

(Preferred Structure of Component (B))

From the viewpoint of good compatibility with the component (A) and low volatility of the component (B) leading to less possibility of causing a problem of outgassing from a curable resin composition to be obtained, the component (B) is preferably a compound obtainable by a hydrosilylation reaction between an organic compound (α) having at least one carbon-carbon double bond reactive with a SiH group per molecule and a compound (β) containing at least two SiH groups per molecule.

(Component (α))

As the component (α), the same compound (α1) as the organic compound having at least two carbon-carbon double bonds reactive with SiH groups per molecule, which is the component (A) mentioned above, may be used. The use of the component (α1) tends to lead to high crosslink density of a cured product to be obtained, and therefore high mechanical strength of the cured product.

Furthermore, an organic compound (α2) having one carbon-carbon double bond reactive with a SiH group per molecule may also be used. When the component (α2) is used, a cured product to be obtained tends to have low elasticity.

(Component (α2))

The component (α2) is not particularly limited as long as it is an organic compound having one carbon-carbon double bond reactive with a SiH group per molecule. In view of good compatibility between the component (B) and the component (A), the component (α2) is preferably a compound containing constituent elements selected exclusively from C, H, N, O, S, and halogens, but not a compound containing a siloxane unit (Si—O—Si) such as polysiloxane-organic block copolymers and polysiloxane-organic graft copolymers.

The bonding site of the carbon-carbon double bond reactive with a SiH group in the component (α2) is not particularly limited, and may be anywhere in the molecule.

Compounds as the component (α2) are classified into polymeric compounds and monomeric compounds.

Examples of the polymeric compounds include polysiloxane compounds, polyether compounds, polyester compounds, polyarylate compounds, polycarbonate compounds, saturated hydrocarbon compounds, unsaturated hydrocarbon compounds, polyacrylic acid ester compounds, polyamide compounds, phenol-formaldehyde compounds (phenol resin compounds), and polyimide compounds.

Examples of the monomeric compounds include phenol compounds, bisphenol compounds, aromatic hydrocarbon compounds such as benzene and naphthalene; aliphatic hydrocarbon compounds such as linear or alicyclic compounds; heterocyclic compounds; silicon compounds; and mixtures thereof.

Although the carbon-carbon double bond reactive with a SiH group of the component (α2) is not particularly limited, it is preferably a group represented by the following formula (I):

wherein $R^1$ represents a hydrogen atom or a methyl group, in view of reactivity. In view of easy availability of materials, a group represented by the following formula:

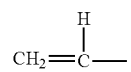

is particularly preferred.

The carbon-carbon double bond reactive with a SiH group of the component (α2) is preferably an alicyclic group represented by the following formula (II):

wherein $R^2$s each represent a hydrogen atom or a methyl group, in view of high thermal resistance of the cured product. In view of easy availability of materials, an alicyclic group represented by the following formula:

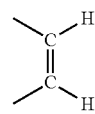

is particularly preferred.

The carbon-carbon double bond reactive with a SiH group may be directly bonded to a skeletal portion of the component (α2), or may be covalently bonded thereto via a bivalent or higher valent substituent. The bivalent or higher valent substituent is not particularly limited as long as it is a substituent having a carbon number of 0 to 10. In view of better compatibility of the component (B) with the component (A), substituents containing constituent elements selected exclusively from C, H, N, O, S and halogens are preferred. Examples of these substituents include those represented by the following formulae.

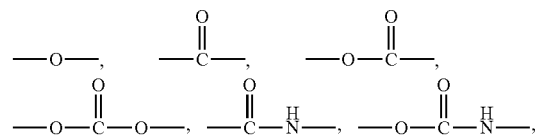

-continued

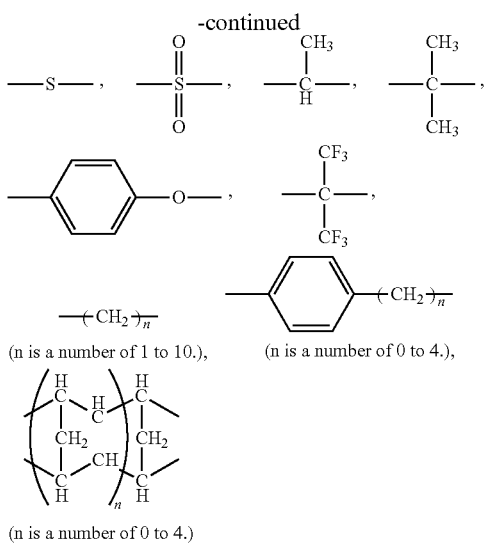

Moreover, two or more of these bivalent or higher valent substituents may be covalently bonded to form one bivalent or higher valent substituent.

Examples of such a group to be covalently bonded to the skeletal portion mentioned above include a vinyl group, allyl group, methallyl group, acryl group, methacryl group, 2-hydroxy-3-(allyloxy)propyl group, 2-allylphenyl group, 3-allylphenyl group, 4-allylphenyl group, 2-(allyloxy)phenyl group, 3-(allyloxy)phenyl group, 4-(allyloxy)phenyl group, 2-(allyloxy)ethyl group, 2,2-bis(allyloxymethyl)butyl group, 3-allyloxy-2,2-bis(allyloxymethyl)propyl group, and groups represented by following formulae:

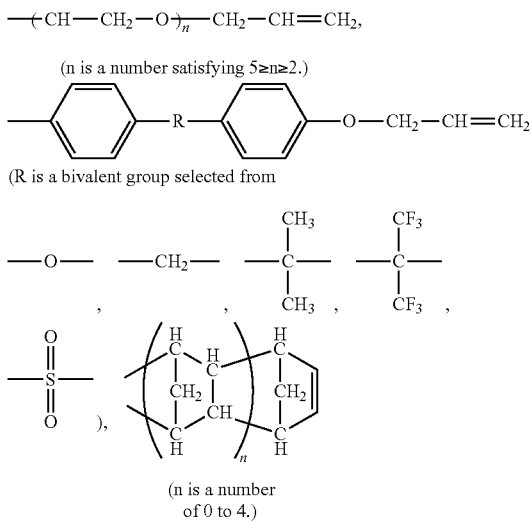

and the like.

Specific examples of the component (α2) include aliphatic acyclic hydrocarbon compounds such as propene, 1-butene, 1-pentene, 1-hexene, 1-heptene, 1-octene, 1-nonene, 1-decene, 1-dodecene, 1-undecene, Linealene species (products of Idemitsu Petrochemical), 4,4-dimethyl-1-pentene, 2-methyl-1-hexene, 2,3,3-trimethyl-1-butene and 2,4,4-trimethyl-1-pentene; aliphatic cyclic hydrocarbon compounds such as cyclohexene, methylcyclohexene, methylenecyclohexane, norbornylene, ethylidenecyclohexane, vinylcyclohexane, camphene, carene, α-pinene and β-pinene; aromatic hydrocarbon compounds such as styrene, α-methylstyrene, indene, phenylacetylene, 4-ethynyltoluene, allylbenzene and 4-phenyl-1-butene; allyl ethers such as alkyl allyl ethers and allyl phenyl ether; aliphatic compounds such as glycerol monoallyl ether, ethylene glycol monoallyl ether and 4-vinyl-1,3-dioxolan-2-one; aromatic compounds such as 1,2-dimethoxy-4-allylbenzene and o-allylphenol; substituted isocyanurates such as monoallyl dibenzyl isocyanurate and monoallyl diglycidyl isocyanurate; and silicon compounds such as vinyltrimethylsilane, vinyltrimethoxysilane and vinyltriphenylsilane. Furthermore, specific examples of the component (α2) include polymers or oligomers containing a vinyl group at one terminal, including polyether resins such as polyethylene oxide allylated at one terminal and polypropylene oxide allylated at one terminal; hydrocarbon resins such as polyisobutylene allylated at one terminal; and acrylic resins such as polybutyl acrylate allylated at one terminal and polymethyl methacrylate allylated at one terminal.

The structure of the component (α2) may be linear or branched. The molecular weight of the component (α2) is not particularly limited and those having various molecular weights may be used. The molecular weight distribution is not particularly limited, either. From the viewpoint that the viscosity of the mixture is reduced and the moldability is more improved, the molecular weight distribution is preferably not higher than 3, more preferably not higher than 2, and still more preferably not higher than 1.5.

In the case where the component (α2) has a glass transition temperature, the glass transition temperature is not particularly limited and those having various glass transition temperatures may be used. From the viewpoint that a cured product to be obtained tends to be tough, the glass transition temperature is preferably not higher than 100° C., more preferably not higher than 50° C., and still more preferably not higher than 0° C. Preferred examples of the resin include polybutyl acrylate resins. Meanwhile, in view of higher thermal resistance of a cured product to be obtained, the glass transition temperature is preferably not lower than 100° C., more preferably not lower than 120° C., still more preferably not lower than 150° C., and most preferably not lower than 170° C. A tan δ peak temperature obtained in a dynamic viscoelasticity measurement is determined as the glass transition temperature.

The component (α2) is preferably a hydrocarbon compound in view of higher thermal resistance of a cured product to be obtained. In this case, the lower limit of the number of carbons is preferably 7, and the upper limit of the number of carbons is preferably 10.

The component (α2) may contain other reactive groups. Examples of such reactive groups include an epoxy group, amino group, radical-polymerizable unsaturated groups, carboxyl group, isocyanate group, hydroxyl group, and alkoxysilyl groups. In the case where the component (α2) contains such a functional group, the resulting curable resin composition tends to have high adhesion property, and the strength of a cured product to be obtained tends to be high. An epoxy group is preferred among the functional groups in view of the possibility of higher adhesion. In view of higher thermal resistance of a cured product to be obtained, the component (α2) preferably contains at least one reactive group per molecule on average. Specific examples of the component (α2) include monoallyl diglycidyl isocyanurate, allyl glycidyl ether, allyloxyethylmethacrylate, allyloxyethyl acrylate, and vinyltrimethoxysilane.

As the component (α1) or/and the component (α2) mentioned above, a single species may be used, or a plurality of species may be used in combination.

(Component (β))

The component (β) is a compound containing at least two SiH groups per molecule. Examples thereof include acyclic and/or cyclic polyorganosiloxanes.

Specifically, for example, compounds represented by the following formulae:

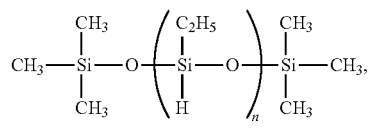

$(n = 3 \sim 1000)$

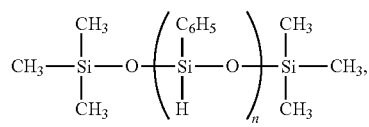

$(n = 3 \sim 1000)$

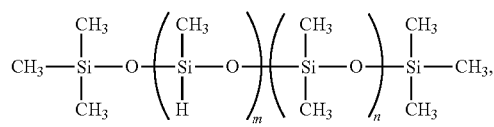

$(m = 3 \sim 1000, n = 0 \sim 1000)$

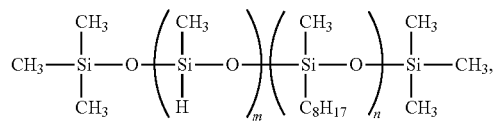

$(m = 3 \sim 1000, n = 0 \sim 1000)$

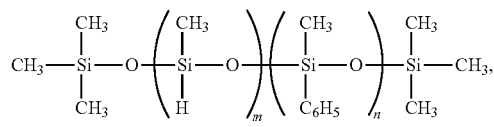

$(m = 3 \sim 1000, n = 0 \sim 1000)$

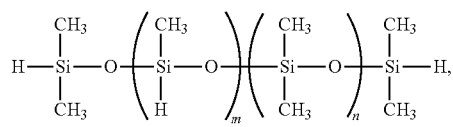

$(m = 1 \sim 1000, n = 0 \sim 1000)$

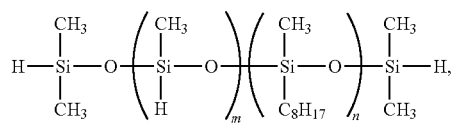

$(m = 1 \sim 1000, n = 0 \sim 1000)$

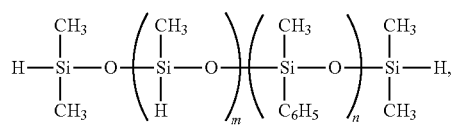

$(m = 1 \sim 1000, n = 0 \sim 1000)$

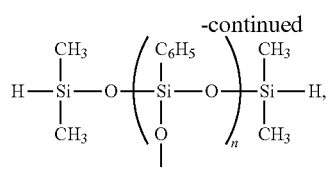

$(n = 1 \sim 1000)$

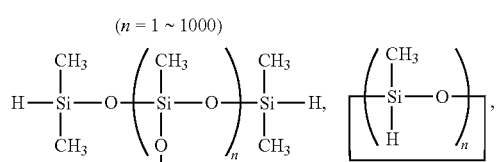

$(n = 1 \sim 1000)$

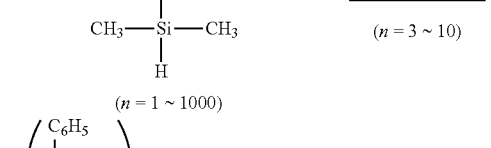

$(n = 3 \sim 10)$

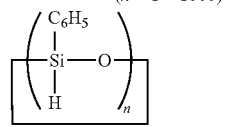

$(n = 3 \sim 10)$ may be mentioned.

Particularly, in view of better compatibility with the component (α), preferred are cyclic polyorganosiloxanes containing at least three SiH groups per molecule, represented by the following formula (VI):

(VI)

wherein $R^1$ represents an organic group having 1 to 6 carbon atoms, and n represents a number of 3 to 10.

The substituent $R^1$ in the compound represented by the formula (VI) is preferably composed of C, H and O. The substituent $R^1$ is more preferably a hydrocarbon group, and still more preferably a methyl group.

In view of easy availability, 1,3,5,7-tetramethylcyclotetrasiloxane is preferred.

Other examples of the component (β) include compounds containing a SiH group, such as bisdimethylsilylbenzene.

The components (β) as mentioned above may be used alone, or two or more kinds thereof may be used in admixture.

(Reaction Between Component (α) and Component (β))

The following description will discuss a hydrosilylation reaction between the component (α) and the component (β) in the case a compound obtainable by a hydrosilylation reaction between the component (α) and the component (β) is used as the component (B) in the present invention.

Here, the hydrosilylation reaction between the component (α) and the component (β) may give a mixture of a plurality of compounds including the component (B) in the present invention. In this case, the curable resin composition of the present invention can be prepared by using the mixture as it is without separating the component (B).

In the case of subjecting the component (α) and the component (β) to a hydrosilylation reaction, the mixing ratio of the component (α) and the component (β) is not particularly limited. Considering the strength of a cured product obtained by a hydrosilylation reaction between the component (B) to be obtained and the component (A), the number of SiH groups in the component (B) is preferably larger. Therefore, generally, the total number (X) of carbon-carbon double bonds reactive with SiH groups in the component (α) to be mixed and the total number (Y) of SiH groups in the component (β) to be mixed preferably satisfy the ratio: $Y/X \geq 2$, and more preferably $Y/X \geq 3$. In view of better compatibility of the component (B) with the component (A), the X and Y preferably satisfy the ratio: $10 \geq Y/X$, and more preferably $5 \geq Y/X$.

An appropriate catalyst may be used in the hydrosilylation reaction of the component (α) and the component (β). The following may be used as the catalyst: a simple substance of platinum; solid platinum supported by a carrier such as alumina, silica, and carbon black; chloroplatinic acid; complexes of chloroplatinic acid with an alcohol, aldehyde, ketone, or the like; platinum-olefin complexes (e.g., $Pt(CH_2=CH_2)_2(PPh_3)_2$, $Pt(CH_2=CH_2)_2Cl_2$), platinum-vinylsiloxane complexes (e.g., $Pt(ViMe_2SiOSiMe_2Vi)_n$, $Pt[(MeViSiO)_4]_m$), platinum-phosphine complexes (e.g., $Pt(PPh_3)_4$, $Pt(PBu_3)_4$), platinum-phosphite complexes (e.g., $Pt[P(OPh)_3]_4$, $Pt[P(OBu)_3]_4$) (in those formulae, Me is a methyl group, Bu is a butyl group, Vi is a vinyl group, Ph is a phenyl group, and n and m are integers); dicarbonyldichloroplatinum; Karstedt catalysts; platinum-hydrocarbon complexes described in Ashby's U.S. Pat. Nos. 3,159,601 and 3,159,662; and platinum alcoholate catalysts described in Lamoreaux's U.S. Pat. No. 3,220,972. In addition, platinum chloride-olefin complexes described in Modic's U.S. Pat. No. 3,516,946 are also usable in the present invention.

Other examples of the catalyst except platinum compounds include $RhCl(PPh_3)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, and $TiCl_4$.

In view of catalytic activity, chloroplatinic acid, platinum-olefin complexes, platinum-vinylsiloxane complexes, and the like are preferred among the above examples. These catalysts may be used alone, or two or more kinds thereof may be used in combination.

The amount of the catalyst added is not particularly limited. For achieving sufficient curing and keeping the costs of the curable resin composition relatively low, the minimum amount is preferably $10^{-8}$ mol, and more preferably $10^{-6}$ mol, per mol of SiH groups in the component (β). The maximum amount is preferably $10^{-1}$ mol, and more preferably $10^{-2}$ mol, per mol of SiH groups in the component (β).

A promoter may be used along with the catalyst. Examples of the promoter include phosphorus compounds such as triphenylphosphine; 1,2-diester compounds such as dimethyl maleate; acetylene alcohol compounds such as 2-hydroxy-2-methyl-1-butyne; sulfur compounds such as a simple substance of sulfur; and amine compounds such as triethylamine. The amount of the promoter added is not particularly limited, but the minimum amount is preferably $10^{-2}$ mol, and more preferably $10^{-1}$ mol, and the maximum amount is preferably $10^2$ mol, and more preferably 10 mol, per mol of the hydrosilylation catalyst.

Various methods may be employed for mixing the component (α), the component (β), and the catalyst for reaction. Preferred is a method of preliminarily mixing the component (α) with the catalyst, and then mixing the mixture with the component (β). A method of adding the catalyst to a mixture of the component (α) and the component (β) leads to difficulty in controlling the reaction. In the case of a method of adding the component (α) to a mixture of the component (β) and the catalyst, the component (β) may be altered because the component (β) can react with existing moisture in the presence of the catalyst.

Various temperatures may be employed for the reaction. The lower limit of the temperature range is preferably 30° C., and more preferably 50° C., and the upper limit of the temperature range is preferably 200° C., and more preferably 150° C. in the reaction. Low reaction temperatures prolong the time for sufficient reaction, and high reaction temperatures are not practical. The reaction may be performed at a constant temperature, or may be performed while the temperature is changed in multiple steps or continuously as needed.

Various reaction times and various pressures during the reaction may be employed as needed.

A solvent may be used in the hydrosilylation reaction. The usable solvent is not particularly limited as long as it does not inhibit the hydrosilylation reaction. Specifically, suitable examples of the solvent include hydrocarbon solvents such as benzene, toluene, hexane, and heptane; ether solvents such as tetrahydrofuran, 1,4-dioxane, 1,3-dioxolane, and diethyl ether; ketone solvents such as acetone, and methyl ethyl ketone; and halogen solvents such as chloroform, methylene chloride, and 1,2-dichloroethane. A mixed solvent containing two or more solvents may be used as the solvent. Toluene, tetrahydrofuran, 1,3-dioxolane, and chloroform are preferred as the solvent. The amount of the solvent to be used may be appropriately set.

Various other additives may be used in order to, for example, control the reactivity.

After the reaction between the component (α) and the component (β), the solvent or/and the unreacted component (α) or/and component (β) may be removed. By removing these volatiles, the resulting component (B) does not contain any volatiles so that problems of voids and cracks caused by volatilization of volatiles are less likely to occur during curing with the component (A). Examples of the removal method include vacuum distillation, and treatment with activated carbon, aluminum silicate, silica gel, or the like. The vacuum distillation is preferably performed at low temperatures. In this case, the upper limit of the temperature is preferably 100° C., and more preferably 60° C. Treatment at high temperatures tends to lead to alteration such as thickening.

Examples of the component (B) that is a reaction product of the component (α) and the component (β) as mentioned above include a reaction product of bisphenol A diallyl ether and 1,3,5,7-tetramethylcyclotetrasiloxane, a reaction product of vinylcyclohexene and 1,3,5,7-tetramethylcyclotetrasiloxane, a reaction product of divinylbenzene and 1,3,5,7-tetramethylcyclotetrasiloxane, a reaction product of dicyclopentadiene and 1,3,5,7-tetramethylcyclotetrasiloxane, a reaction product of triallyl isocyanurate and 1,3,5,7-tetramethylcyclotetrasiloxane, a reaction product of diallyl monoglycidyl isocyanurate and 1,3,5,7-tetramethylcyclotetrasiloxane, a reaction product of allyl glycidyl ether and 1,3,5,7-tetramethylcyclotetrasiloxane, a reaction product of α-methylstyrene and 1,3,5,7-tetramethylcyclotetrasiloxane, a reaction product of monoallyl diglycidyl isocyanurate and 1,3,5,7-tetramethylcyclotetrasiloxane, a reaction product of vinyl norbornene and bisdimethylsilylbenzene, and the like.

(Mixing of Component (A) and Component (B))

Examples of combinations of the component (A) and the component (B) include various combinations of the compounds mentioned as examples of the component (A) or mixtures thereof, and the compounds mentioned as examples of the component (B) or mixtures thereof.

The mixing ratio of the component (A) and the component (B) is not particularly limited as long as the required strength is not lost. With respect to the ratio of the number (Y) of SiH groups in the component (B) to the number (X) of carbon-carbon double bonds in the component (A), the lower limit of the ratio is preferably Y/X≥0.3, more preferably Y/X≥0.5, and still more preferably Y/X≥0.7, and the upper limit of the ratio is preferably 3≥Y/X, more preferably 2≥Y/X, and still more preferably 1.5≥Y/X. If the ratio is not in these preferred ranges, a sufficient strength may not be achieved, or thermal deterioration may tend to occur easily.
(Component (C))

The component (C) is a hydrosilylation catalyst.

The hydrosilylation catalyst is not particularly limited as long as it catalyzes a hydrosilylation reaction. Examples of the catalyst include a simple substance of platinum; solid platinum supported by a carrier such as alumina, silica, carbon black or the like; chloroplatinic acid; complexes of chloroplatinic acid with an alcohol, aldehyde, ketone, or the like; platinum-olefin complexes (e.g., Pt(CH$_2$=CH$_2$)$_2$(PPh$_3$)$_2$, Pt(CH$_2$=CH$_2$)$_2$Cl$_2$), platinum-vinylsiloxane complexes (e.g., Pt(ViMe$_2$SiOSiMe$_2$Vi)$_n$, Pt[(MeViSiO)$_4$]$_m$), platinum-phosphine complexes (e.g., Pt(PPh$_3$)$_4$, Pt(PBu$_3$)$_4$), platinum-phosphite complexes (e.g., Pt[P(OPh)$_3$]$_4$, Pt[P(OBu)$_3$]$_4$) (in those formulae, Me is a methyl group, Bu is a butyl group, Vi is a vinyl group, Ph is a phenyl group, and n and m are integers); dicarbonyldichloroplatinum; Karstedt catalysts; platinum-hydrocarbon complexes described in Ashby's U.S. Pat. Nos. 3,159,601 and 3,159,662; and platinum alcoholate catalysts described in Lamoreaux's U.S. Pat. No. 3,220,972. In addition, platinum chloride-olefin complexes described in Modic's U.S. Pat. No. 3,516,946 are also usable in the present invention.

Other examples of the catalyst except platinum compounds include RhCl(PPh)$_3$, RhCl$_3$, RhAl$_2$O$_3$, RuCl$_3$, IrCl$_3$, FeCl$_3$, AlCl$_3$, PdCl$_2$·2H$_2$O, NiCl$_2$, and TiCl$_4$.

In view of catalytic activity, chloroplatinic acid, platinum-olefin complexes, platinum-vinylsiloxane complexes, and the like are preferred among the above examples. These catalysts may be used alone, or two or more kinds thereof may be used in combination.

The amount of the catalyst added is not particularly limited. For achieving sufficient curing and keeping the costs of the curable resin composition relatively low, the minimum amount is preferably $10^{-8}$ mol, and more preferably $10^{-6}$ mol, per mol of SiH groups in the component (B). The maximum amount is preferably $10^{-1}$ mol, and more preferably $10^{-2}$ mol, per mol of SiH groups in the component (B).

A promoter may be used along with the catalyst. Examples of the promoter include phosphorus compounds such as triphenylphosphine; 1,2-diester compounds such as dimethyl maleate; acetylene alcohol compounds such as 2-hydroxy-2-methyl-1-butyne; sulfur compounds such as a simple substance of sulfur; and amine compounds such as triethylamine. The amount of the promoter added is not particularly limited. The minimum amount is preferably $10^{-2}$ mol, and more preferably $10^{-1}$ mol, and the maximum amount is preferably $10^2$ mol, and more preferably 10 mol, per mol of the hydrosilylation catalyst.
(Component (D))

The component (D) in the present invention is a silicone compound having at least one carbon-carbon double bond reactive with a SiH group per molecule. The component (D), when mixed with an inorganic filler as the component (E), enables the curable resin composition to give a cured product having a lower linear expansion coefficient.

The silicone compound as the component (D) is a compound having a skeleton substantially formed of Si—O—Si bonds. Various kinds of compounds including those having a linear, circular, or branched structure or having a partial network may be used.

Examples of substituents that may be bonded to such a skeleton include alkyl groups such as a methyl group, ethyl group, propyl group, and octyl group; aryl groups such as a phenyl group, 2-phenylethyl group, and 2-phenylpropyl group; alkoxy groups such as a methoxy group, ethoxy group, and isopropoxy group; and a hydroxyl group. In view of higher tendency of higher thermal resistance, a methyl group, phenyl group, hydroxyl group, and methoxy group are preferred, and a methyl group and phenyl group are more preferred among the above examples. Examples of the substituents containing a carbon-carbon double bond reactive with a SiH group include a vinyl group, allyl group, acryloxy group, methacryloxy group, acryloxypropyl group, and methacryloxypropyl group. In view of good reactivity, a vinyl group is preferred among the examples.

Examples of the component (D) may include compounds representable by the following formula:

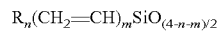

$$R_n(CH_2=CH)_m SiO_{(4-n-m)/2}$$

wherein R represents a group selected from a hydroxyl group, a methyl group, and a phenyl group, and n and m each represent a number satisfying 0≤n<4, 0<m≤4, and 0<n+m≤4).

Examples of the component (D) include polydimethylsiloxane, polydiphenylsiloxane and polymethylphenylsiloxane each containing a vinyl group as a terminal group or side-chain group, and random or block copolymers of two or three kinds thereof, 1,3-divinyltetramethyldisiloxane, and 1,3,5,7-tetravinylcyclotetrasiloxane. A plurality of the components (D) may be used in admixture.

Among the above examples, because the effects of the present invention become larger, linear polysiloxanes containing a vinyl group at a terminal thereof are preferred, linear polysiloxanes containing a vinyl group at both terminals thereof are more preferred, linear polymethylphenylsiloxanes containing a vinyl group at both terminals thereof are still more preferred, and linear polymethylphenylsiloxanes containing a vinyl group at both terminals thereof and having a phenyl content of not less than 20 mol % of the total substituents are particularly preferred.

Regarding the molecular weight of the component (D), the weight average molecular weight (Mw) of the component (D) is preferably not less than 1,000, more preferably not less than 5,000, and still more preferably not less than 10,000. A larger molecular weight tends to lead to further reduction in stress of a cured product to be obtained. The molecular weight of the component (D) is preferably not more than 1,000,000, and more preferably not more than 100,000. A larger molecular weight leads to less compatibility with the component (A).

Regarding the amount of the component (D), the weight of the component (D) is preferably not less than 30% by weight, more preferably not less than 50% by weight, and still more preferably not less than 80% by weight, of the total weight of the component (A) and the component (B).

The mixing ratio of the component (A), the component (B), and the component (D) is not particularly limited as long as the required strength is not lost. With respect to the ratio of the number (Y) of SiH groups in the component (B) to the number (X) of carbon-carbon double bonds reactive with SiH groups in the component (A) and the component (D), the lower limit of the ratio is preferably Y/X≥0.3, more preferably Y/X≥0.5, and still more preferably Y/X≥0.7, and the upper limit of the ratio is preferably 3≥Y/X, more preferably 2≥Y/X, and still more preferably 1.5≥Y/X. If the ratio is not in these preferred ranges, a sufficient strength may not be achieved, or thermal deterioration tends to occur easily.

The component (E) is an inorganic filler.

The component (E) has an effect in enhancing the strength and hardness of a cured product to be obtained, and in reducing its linear expansion coefficient.

Various substances can be used as the inorganic filler (E). Examples thereof include silica-based inorganic fillers such as quartz, fumed silica, precipitated silica, silicic anhydride, fused silica, crystalline silica and ultrafine amorphous silica; inorganic fillers such as alumina, zircon, titanium oxide, zinc oxide, silicon nitride, boron nitride, aluminum nitride, silicon carbide, glass fiber, alumina fiber, carbon fiber, mica, graphite, carbon black, graphite, diatomaceous earth, white clay, clay, talc, aluminum hydroxide, calcium carbonate, magnesium carbonate, barium sulfate, barium titanate, potassium titanate, calcium silicate, inorganic balloons, and silver powder; and other inorganic fillers commonly used or/and proposed as fillers for conventional sealing materials such as epoxy sealing materials. In view of less damage to semiconductor elements, the inorganic filler is preferably less radioactive.

The inorganic filler may be appropriately surface-treated. Examples of the surface treatment include alkylation treatment, trimethylsilylation treatment, silicone treatment, and treatment with a coupling agent.

Examples of the coupling agent for such treatment include silane coupling agents. The silane coupling agents are not limited in particular as long as they are compounds each containing at least one each of a functional group reactive with an organic group, and a hydrolysable silicon group per molecule. As the functional group reactive with an organic group, at least one functional group selected from the group consisting of an epoxy group, methacryl group, acryl group, isocyanate group, isocyanurate group, vinyl group and carbamate group is preferred in view of handleability, and an epoxy group, methacryl group and acryl group are particularly preferred in view of curability and adhesion. As the hydrolysable silicon group, alkoxysilyl groups are preferred in view of handleability, and a methoxysilyl group and ethoxysilyl group are particularly preferred in view of reactivity.

Preferred examples of the silane coupling agent include alkoxysilanes containing an epoxy functional group, such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; and alkoxysilanes containing a methacryl group or an acryl group, such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

Other methods may be mentioned as the method for adding the inorganic filler. For example, a method may be mentioned in which a hydrolysable silane monomer or oligomer such as alkoxysilanes, acyloxysilanes and halogenated silanes, or an alkoxide, acyloxide or halide of a metal such as titanium or aluminum, or the like is added to the curable resin composition of the present invention and allowed to react in the curable resin composition or a partial reaction product of the curable resin composition to generate an inorganic filler in the curable resin composition.

Silica-based inorganic fillers are preferred among the above inorganic fillers from the viewpoint of less possibility of inhibiting the curing reaction, larger effect of reducing the linear expansion coefficient, and higher adhesion to a lead frame. Moreover, in view of good balance of physical properties such as moldability and electric properties, fused silica is preferred. From the viewpoint that the thermal conductivity of the package tends to be high, which enables package designs with high heat dissipation performance, crystalline silica is preferred. For higher heat dissipation performance, alumina is preferred. In view of high light reflectance of the package resin, which leads to higher light extraction efficiency of a light-emitting diode to be obtained, titanium oxide is preferred. In addition, in view of high reinforcing effect which leads to higher strength of the package, glass fiber, potassium titanate, and calcium silicate are preferred.

The average particle size and particle size distribution of the inorganic filler are not particularly limited, and those having various values may be used such as inorganic fillers used or/and proposed as fillers for conventional sealing materials such as epoxy sealing materials. The minimum average particle size is usually 0.1 μm, and is preferably 0.5 μm in view of better fluidity. The maximum average particle size is usually 120 μm, and is preferably 60 μm, and more preferably 15 μm in view of better fluidity.

Inorganic fillers having various specific surface areas may also be used such as those used or/and proposed as fillers for conventional sealing materials such as epoxy sealing materials.

The inorganic fillers may have various shapes such as a crushed shape, a flake shape, a spherical shape, and a bar shape. Inorganic fillers having various aspect ratios may also be used. The aspect ratio is preferably not less than 10 in view of higher strength of a cured product to be obtained. Moreover, considering isotropic shrinkage of the resin, the inorganic filler preferably has a powder form rather than a fiber form. Alternatively, a spherical shape is preferred in view of better fluidity during molding even if the inorganic filler is highly filled.

These inorganic fillers may be used alone, or two or more kinds thereof may be used in combination.

Although the amount of the component (E) is not particularly limited, the total amount of the component (E) is preferably 70% by weight or more, more preferably 80% by weight of more, and still more preferably 90% by weight or more, of the whole curable resin composition. A small amount of the component (E) is less likely to have an effect in enhancing the strength and hardness and in reducing the linear expansion coefficient.

Regarding the order of mixing the inorganic filler as the component (E), various methods are applicable. However, in view of better storage stability of intermediate materials for the curable resin composition, a method is preferred in which the component (A) is mixed with the component (C) and the inorganic filler, and then the resulting mixture is mixed with the component (B). In the case of a method of mixing the component (B) with the component (C) and/or the inorganic filler, and then mixing the resulting mixture with the component (A), since the component (B) can react with moisture in the environment and/or the inorganic filler in the presence or absence of the component (C), the component (B) may be altered during storage or the like. Moreover, from the viewpoint that the reactive components (A), (B), and (C) tend to be well mixed to give a stable molded product, it is preferable to mix the inorganic filler with a mixture of the component (A), the component (B), and the component (C).

As the means of mixing the inorganic filler as the component (E), various means conventionally employed and/or proposed for epoxy resin or the like may be employed. Examples of the means include mixers such as two-roll or three-roll mills, planetary mixing and defoaming machines, homogenizers, dissolvers, and planetary mixers, and melt mixers such as Plastomill. Among these, three-roll mills and melt mixers are preferred from the viewpoint that sufficient dispersibility of the inorganic filler tends to be achieved even if the filler is highly filled. The inorganic filler may be mixed at normal temperature or under heating, and also may be mixed at ordinary pressure or in vacuum. From the viewpoint that sufficient dispersibility of the inorganic filler tends to be achieved even if the inorganic filler is highly filled, the mixing is preferably performed under heating. From the viewpoint that the wettability of the surface of the inorganic filler tends to be enhanced, and sufficient dispersibility tends to be achieved, the mixing is preferably performed in vacuum.

(Component (F))

The curable resin composition of the present invention may preferably contain a white pigment (component (F)).

The component (F) is a white pigment, and has an effect in enhancing the light reflectance of a cured product to be obtained.

Various substances may be used as the component (F), and examples thereof include titanium oxide, zinc oxide, magnesium oxide, antimony oxide, zirconium oxide, strontium oxide, niobium oxide, boron nitride, barium titanate, zinc sulfide, barium sulfate, magnesium carbonate, and hollow glass particles. From the viewpoint of easy handleability, availability and cost, titanium oxide or zinc oxide is preferred among these examples.

Various titanium oxides may be used as the component (F), and may be anatase types or rutile types. In view of no photocatalytic activity and of higher stability of the curable resin composition, rutile types are preferred.

As the component (F), those having various average particle sizes may be used. However, in view of higher light reflectance of a cured product to be obtained and greater hardness of the curable resin composition tablet, the component (F) preferably has an average particle size of not more than 1.0 μm, more preferably not more than 0.30 μm, and most preferably not more than 0.25 μm.

Meanwhile, from the viewpoint of high fluidity of the curable resin composition, the average particle size is preferably not less than 0.05 μm, and more preferably not less than 0.1 μm.

The average particle size can be measured using a laser diffraction/scattering particle size distribution analyzer.

Titanium oxides produced by any methods including the sulfate process and the chloride process, may be used as the titanium oxide as the component (F).

The component (F) may be surface-treated.

In the surface treatment of the component (F), the surface of the component (F) is coated with at least one selected from inorganic compounds and organic compounds. Examples of the inorganic compounds include aluminum compounds, silicon compounds, zirconium compounds, tin compounds, titanium compounds and antimony compounds. Examples of the organic compounds include polyhydric alcohols, alkanolamines or derivatives thereof, organosilicon compounds such as organosiloxanes, higher fatty acids or metal salts thereof, and organometallic compounds.

In the case where the surface of the component (F) is coated with an inorganic compound or organic compound, the surface treatment may be performed by a known method such as a wet method or a dry method when titanium oxide is, for example, dry-ground, made into a slurry, or wet-ground. Various other methods may also be mentioned such as a liquid phase method and a gas phase method.

Treatment with an organosiloxane, among the above examples, is preferred because this treatment contributes to high light reflectance of a cured product to be obtained, and good thermal and light resistance. Moreover, inclusion of titanium oxide surface-treated with an organosiloxane is favorable for producing an excellent light-emitting diode which has high light-extraction efficiency and maintains the light-extraction efficiency even after a long time use.

Various organosiloxane agents are applicable for such surface treatment. Examples thereof include silane coupling agents exemplified by, for example, polysiloxanes such as polydimethylsiloxane, polymethylphenylsiloxane, polymethylhydrogensiloxanes, and copolymers thereof; cyclosiloxanes such as hexamethylcyclotrisiloxane, heptamethylcyclotetrasiloxane, and 1,3,5,7-tetramethylcyclotetrasiloxane; various silanes including chlorosilanes such as trimethylchlorosilane, dimethyldichlorosilane and methyltrichlorosilane; silanes containing an epoxy functional group such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; silanes containing a methacryl group or an acryl group such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane; silanes containing a vinyl group such as vinyltrichlorosilane, vinyltrimethoxysilane, vinyltriethoxysilane, vinyltris(β-methoxyethoxy)silane and vinyltriacetoxysilane; mercaptosilanes such as γ-mercaptopropyltrimethoxysilane and γ-mercaptopropylmethyldimethoxysilane; silanes containing an amino group such as γ-aminopropyltriethoxysilane, γ-[bis(β-hydroxyethyl)]aminopropyltriethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine and N-β-(N-vinylbenzylaminoethyl)-γ-aminopropyltrimethoxysilane; silanes containing an isocyanate group such as isocyanatepropyltrimethoxysilane and isocyanatepropyltriethoxysilane; silanes containing an alkyl group such as methyltrimethoxysilane, methyltriethoxysilane, hexyltrimethoxysilane, hexyltriethoxysilane, octyltrimethoxysilane and octyltriethoxysilane; and other silanes such as γ-chloropropyltrimethoxysilane and γ-anilinopropyltrimethoxysilane, as well as hexamethyldisiloxane, hexamethyldisilazane, and the like. Among these surface treatment agents, those not containing a carbon-carbon double bond are preferred. Those containing a carbon-carbon double bond tend to reduce the thermal resistance. Moreover, surface treatment with a substance other than organosiloxanes, such as Al, Zr, Zn, or the like, may be concomitantly performed.

Furthermore, the component (F) may be surface-treated with an inorganic compound.

The surface treatment with an inorganic compound is not particularly limited, and examples thereof include various surface treatments with aluminum compounds, silicon compounds, zirconium compounds or the like. Titanium oxide is in some cases surface-treated with an inorganic compound or organic compound for the purpose of enhancing the durability, increasing the affinity for solvents, preventing loss of shape in particles, or the like. It is considered that surface treatment of the component (F) with an inorganic compound leads to higher affinity for the components contained in the curable resin composition, and therefore better dispersibility of the component (F) in the curable resin composition, thereby enhancing the strength of a cured product to be obtained.

Various methods are applicable for the surface treatment, and examples thereof include various methods such as a wet method, a dry method, a liquid phase method, and a gas phase method.

The amount of the component (F) is not particularly limited, and is preferably not less than 10% by weight, more preferably not less than 15% by weight, and still more preferably not less than 20% by weight, of the whole curable resin composition. If the amount is less than 10% by weight, the resulting cured product may have a reduced light reflectance.

(Component (E) and Component (F))

The total amount of the component (E) and the component (F) is not particularly limited; however, the total amount of the component (E) and the component (F) is preferably not less than 85% by weight, and more preferably not less than 90% by weight, of the whole curable resin composition.

A small total amount of the component (E) and the component (F) is less likely to have an effect in enhancing the strength and hardness, and in reducing the linear expansion coefficient.

Regarding the order of mixing the component (F), various methods may be employed. Preferred embodiments are similar to those described for the component (E). Moreover, the component (F) and the component (E) may be added simultaneously.

The means for mixing the component (F) may be the same as those for mixing the component (E).

(Component (G))

The curable resin composition of the present invention may preferably contain a metal soap (component (G)).

The component (G) is added for improving the moldability such as mold releasability of the curable resin composition.

Various conventionally-used metal soaps may be used as the component (G). The metal soap herein generally refers to a product in which a long chain fatty acid is bonded to a metal ion, and any metal soap can be used as long as it has a nonpolar or low-polar moiety derived from the fatty acid and a polar moiety derived from the bonding site with the metal in a molecule. Examples of the long chain fatty acid include C1-C18 saturated fatty acids, C3-C18 unsaturated fatty acids, and aliphatic dicarboxylic acids. Among these, C1-C18 saturated fatty acids are preferred in view of easy availability and high industrial practicability. Moreover, in view of effective mold releasability, C6-C18 saturated fatty acids are more preferred. Examples of the metal ion include alkali metal ions, and alkaline earth metal ions, as well as zinc, cobalt, aluminum, and strontium ions. Specific examples of the metal soap include lithium stearate, lithium 12-hydroxystearate, lithium laurate, lithium oleate, lithium 2-ethylhexanoate, sodium stearate, sodium 12-hydroxystearate, sodium laurate, sodium oleate, sodium 2-ethylhexanoate, potassium stearate, potassium 12-hydroxystearate, potassium laurate, potassium oleate, potassium 2-ethylhexanoate, magnesium stearate, magnesium 12-hydroxystearate, magnesium laurate, magnesium oleate, magnesium 2-ethylhexanoate, calcium stearate, calcium 12-hydroxystearate, calcium laurate, calcium oleate, calcium 2-ethylhexanoate, barium stearate, barium 12-hydroxystearate, barium laurate, zinc stearate, zinc 12-hydroxystearate, zinc laurate, zinc oleate, zinc 2-ethylhexanoate, lead stearate, lead 12-hydroxystearate, cobalt stearate, aluminum stearate, manganese oleate, and barium ricinoleate. Among these metal soaps, metal stearates are preferred in view of easy availability and high safety which lead to high industrial practicability. Particularly from the economic viewpoint, at least one selected from the group consisting of calcium stearate, magnesium stearate, and zinc stearate is most preferred.

The amount of the metal soap added is not particularly limited. The minimum amount is preferably 0.01 parts by weight, more preferably 0.025 parts by weight, and still more preferably 0.05 parts by weight, relative to 100 parts by weight of the whole curable resin composition. The maximum amount is preferably 5 parts by weight, and more preferably 4 parts by weight, relative to 100 parts by weight of the whole curable resin composition. Addition of an excessive amount of the metal soap may lead to reduction in physical properties of the cured product. Addition of too small amount of the metal soap may not ensure mold releasability.

(Additives)

The curable resin composition of the present invention may contain various additives.

(Curing Retardant)

In order to improve the storage stability of the curable resin composition of the present invention, or to control the reactivity of the hydrosilylation reaction in the production process, a curing retardant may be used. Examples of the curing retardant include compounds containing an aliphatic unsaturated bond, organophosphorus compounds, organosulfur compounds, nitrogen-containing compounds, tin compounds and organic peroxides. These may be used in combination.

Examples of the compounds containing an aliphatic unsaturated bond include: propargyl alcohols such as 3-hydroxy-3-methyl-1-butyne, 3-hydroxy-3-phenyl-1-butyne and 1-ethynyl-1-cyclohexanol; ene-yne compounds; and maleates such as dimethyl maleate. Examples of the organophosphorus compounds include triorganophosphines, diorganophosphines, organophosphones and triorganophosphites. Examples of the organosulfur compounds include organomercaptans, diorganosulfides, hydrogen sulfide, benzothiazole, thiazole and benzothiazole disulfide. Examples of the nitrogen-containing compounds include ammonia, primary, secondary or tertiary alkylamines, arylamines, urea and hydrazine. Examples of the tin compounds include stannous halide dihydrate and stannous carboxylates. Examples of the organic peroxides include di-tert-butyl peroxide, dicumyl peroxide, benzoyl peroxide and tert-butyl peroxybenzoate.

In view of favorable retardation activity and good availability of materials, preferred among these curing retardants are benzothiazole, thiazole, dimethyl maleate, 3-hydroxy-3-methyl-1-butyne and 1-ethynyl-1-cyclohexanol.

Various amounts of the curing retardant may be added. The minimum amount of the curing retardant added is preferably $10^{-1}$ mol, and more preferably 1 mol, and the maximum amount is preferably $10^3$ mol, and more preferably 50 mol, per mol of the hydrosilylation catalyst used.

These curing retardants may be used alone, or two or more of them may be used in combination.

(Adhesion Promoter)

An adhesion promoter may be added in the curable resin composition of the present invention. Examples of the adhesion promoter include commonly used adhesives, as well as, for example, various coupling agents, epoxy compounds, phenol resins, coumarone-indene resins, rosin ester resins, terpene-phenol resins, α-methylstyrene-vinyltoluene copolymers, polyethylmethylstyrene and aromatic polyisocyanates.

Examples of the coupling agents include silane coupling agents and titanate coupling agents.

Examples and preferred examples of the coupling agents are the same as those mentioned above.

Although various amounts of the coupling agent may be added, the minimum amount is preferably 0.1 parts by weight, and more preferably 0.5 parts by weight, and the maximum amount is preferably 50 parts by weight, and more preferably 25 parts by weight, relative to 100 parts by weight of the total of the component (A) and the component (B). If the amount added is smaller, the adhesion-promoting effect may not be manifested, while if the amount added is larger, adverse effects may occur to the physical properties of the cured product.

Examples of the epoxy compounds include novolac phenol epoxy resin, biphenyl epoxy resin, dicyclopentadiene epoxy resin, bisphenol F diglycidyl ether, bisphenol A diglycidyl ether, 2,2'-bis(4-glycidyloxycyclohexyl)propane, 3,4-epoxycyclohexylmethyl-3,4-epoxycyclohexane carboxylate, vinylcyclohexene dioxide, 2-(3,4-epoxycyclohexyl)-5,5-spiro-(3,4-epoxycyclohexane)-1,3-dioxane, bis (3,4-epoxycyclohexyl)adipate, 1,2-cyclopropanedicarboxylic acid bisglycidyl ester, and triglycidyl isocyanurate, monoallyl diglycidyl isocyanurate, and diallyl monoglycidyl isocyanurate.

Various amounts of the epoxy compound may be added. The minimum amount is preferably 1 part by weight, and more preferably 3 parts by weight, and the maximum amount is preferably 50 parts by weight, and more preferably 25 parts by weight, relative to 100 parts by weight of the total of the component (A) and the component (B). A smaller amount of the epoxy compound may fail to exert the adhesion-promoting effect, and a larger amount thereof may have adverse effects on the physical properties of the cured product.

Each of these coupling agents, silane coupling agents, epoxy compounds, and the like may be used alone, or two or more of these may be used in combination.

In the present invention, a silanol condensation catalyst may also be used for the purpose of enhancing the effects of the coupling agent or epoxy compound, and its use contributes to enhancement of adhesion and/or stabilization. Although the silanol condensation catalyst is not particularly limited, it is preferably a boron compound or/and aluminum compound or/and titanium compound. Examples of aluminum compounds usable as the silanol condensation catalyst include: aluminum alkoxides such as aluminum triisopropoxide, sec-butoxyaluminum diisopropoxide, and aluminum tri-sec-butoxide; and aluminum chelates such as ethylacetoacetate aluminum diisopropoxide, aluminum tris (ethylacetoacetate), aluminum chelate M (produced by Kawaken Fine Chemicals Co., Ltd., alkylacetoacetate aluminum diisopropoxide), aluminum tris(acetylacetonate), and aluminum monoacetylacetonate bis(ethylacetoacetate). In view of handleability, aluminum chelates are more preferred. Examples of titanium compounds usable as the silanol condensation catalyst include: tetraalkoxy titaniums such as tetraisopropoxy titanium and tetrabutoxy titanium; titanium chelates such as titanium tetraacetylacetonate; and general titanate coupling agents containing a residue such as oxyacetate or ethylene glycol.

Examples of boron compounds usable as the silanol condensation catalyst include borate esters. Suitable examples of the borate esters include compounds represented by the following formulae (VII) and V (III):

$$B(OR^1)_3 \quad \text{(VII)}$$

$$B(OCOR^1)_3 \quad \text{(VIII)}$$

wherein $R^1$s each represent an organic group having 1 to 48 carbon atoms.

Preferred specific examples of the borate esters include tri-2-ethylhexyl borate, tri-n-octadecyl borate, tri-n-octyl borate, triphenyl borate, trimethylene borate, tris(trimethylsilyl)borate, tri-n-butyl borate, tri-sec-butyl borate, tri-tert-butyl borate, triisopropyl borate, tri-n-propyl borate, triallyl borate, triethyl borate, trimethyl borate, and boron methoxyethoxide.

These borate esters may be used alone, or two or more of them may be used in admixture. Mixing may be performed in advance, or may be performed upon producing cured products.

In view of easy availability and high industrial practicability, trimethyl borate, triethyl borate, and tri-n-butyl borate are preferred, and in particular, trimethyl borate is more preferred among the above borate esters.

In view of suppression of volatilization during curing, tri-n-octadecyl borate, tri-n-octyl borate, triphenyl borate, trimethylene borate, tris(trimethylsilyl)borate, tri-n-butyl borate, tri-sec-butyl borate, tri-tert-butyl borate, triisopropyl borate, tri-n-propyl borate, triallyl borate, and boron methoxyethoxide are preferred, and in particular, tri-n-octadecyl borate, tri-tert-butyl borate, triphenyl borate, and tri-n-butyl borate are more preferred.

In terms of suppressed volatilization and good workability, tri-n-butyl borate, triisopropyl borate, and tri-n-propyl borate are preferred, and especially tri-n-butyl borate is more preferred.

In terms of less coloring under high temperatures, trimethyl borate and triethyl borate are preferred, and especially trimethyl borate is more preferred.

In the case where the silanol condensation catalyst is used, although various amounts may be used, the minimum amount of the silanol condensation catalyst is preferably 0.1 parts by weight, and more preferably 1 part by weight, while the maximum amount is preferably 50 parts by weight, and more preferably 30 parts by weight, relative to 100 parts by weight of the coupling agent or/and epoxy compound. If the addition amount is smaller, then no adhesion-promoting effect may be achieved. If the addition amount is larger, adverse effects may occur to the physical properties of the cured product.

These silanol condensation catalysts may be used alone, or two or more kinds thereof may be used in combination.

In order to further enhance the adhesion-promoting effect in the present invention, a silanol source compound may also be used, and its use contributes to enhancement of adhesion and/or stabilization. Examples of such a silanol source include: silanol compounds such as triphenyl silanol and diphenyldihydroxysilane; and alkoxysilanes such as diphenyldimethoxysilane, tetramethoxysilane, and methyltrimethoxysilane.

In the case where the silanol source compound is used, although various amounts may be used, the minimum amount of the silanol source compound is preferably 0.1 parts by weight, and more preferably 1 part by weight, while the maximum amount is preferably 50 parts by weight, and more preferably 30 parts by weight, relative to 100 parts by weight of the coupling agent or/and epoxy compound. If the addition amount is smaller, no adhesion-promoting effect may be achieved. If the addition amount is larger, adverse effects may occur to the physical properties of the cured product.

These silanol source compounds may be used alone, or two or more kinds thereof may be used in combination.

In the present invention, in order to enhance the effects of the coupling agent or epoxy compound, a carboxylic acid or/and an acid anhydride may be used, and its use contributes to enhancement of adhesion and/or stabilization. Although such carboxylic acids and acid anhydrides are not particularly limited, examples thereof include those represented by the following formulae:

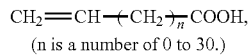

(n is a number of 0 to 30.)

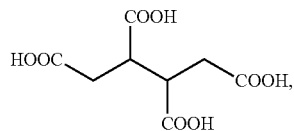

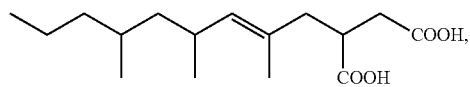

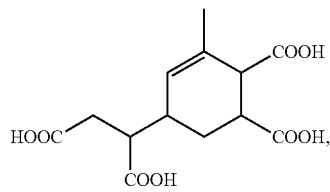

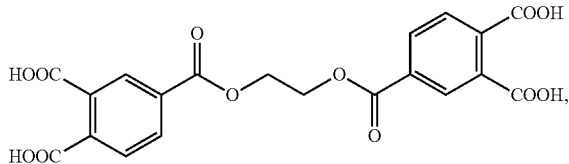

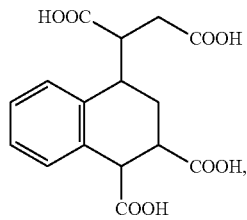

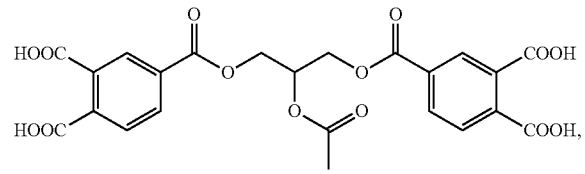

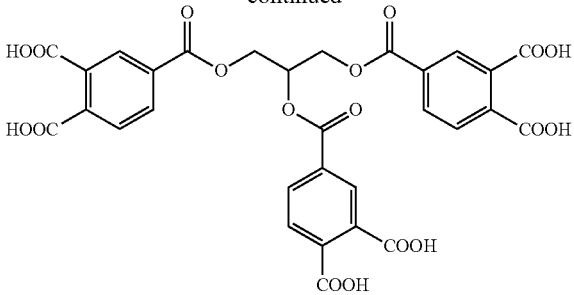

and 2-ethylhexanoic acid, cyclohexanecarboxylic acid, cyclohexanedicarboxylic acid, methylcyclohexanedicarboxylic acid, tetrahydrophthalic acid, methyltetrahydrophthalic acid, methylhymic acid, norbornenedicarboxylic acid, hydrogenated methylnadic acid, maleic acid, acetylenedicarboxylic acid, lactic acid, malic acid, citric acid, tartaric acid, benzoic acid, hydroxybenzoic acid, cinnamic acid, phthalic acid, trimellitic acid, pyromellitic acid, naphthalenecarboxylic acid, naphthalenedicarboxylic acid, and anhydrides of one or more of these acids.

Among these carboxylic acids and/or acid anhydrides, ones containing a carbon-carbon double bond reactive with a SiH group are preferred because they have hydrosilylation reactivity and are less likely to bleed from a cured product to be obtained, so that the physical properties of the cured product are less likely to be impaired. Preferred examples of the carboxylic acids or/and acid anhydrides include those represented by the following formula:

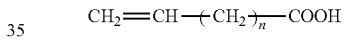

(n is a number of 0 to 30.)

and tetrahydrophthalic acid, methyltetrahydrophthalic acid, and anhydrides of one or more of these acids.

In the case where the carboxylic acid or/and acid anhydride is used, although various amounts thereof may be used, the minimum addition amount is preferably 0.1 parts by weight, and more preferably 1 part by weight, while the maximum addition amount is preferably 50 parts by weight, and more preferably 10 parts by weight, relative to 100 parts by weight of the coupling agent or/and epoxy compound. If the addition amount is smaller, then no adhesion-promoting effect may be achieved. If the addition amount is larger, then adverse effects may occur to the physical properties of the cured product.

These carboxylic acids or/and acid anhydrides may be used alone, or two or more types thereof may be used in combination.

The curable resin composition of the present invention may contain silane compounds mentioned above. The silane compounds contribute to enhancement of adhesion to a lead, and are thus effective for preventing invasion of water through an interface between the package and the lead. Examples of the silane compounds include dimethyldimethoxysilane, dimethyldiethoxysilane, diphenyldimethoxysilane, diphenyldiethoxysilane, methylphenyldimethoxysilane, and methylphenyldiethoxysilane. Particularly, dimethyldimethoxysilane is preferred among these.

(Cured Product of Thermosetting Resin)

A cured product of a thermosetting resin may be crushed into particles and then mixed. In the case where the thermosetting resin is used as dispersed particles, although various average particle sizes may be employed, the minimum average particle size is preferably 10 nm, and the maximum average particle size is preferably 10 μm. The particle system may have a distribution, and may either be monodispersed or have a plurality of peak particle sizes. From the viewpoint that the viscosity of the curable resin composition tends to be low, and thus the moldability tends to be better, the coefficient of variation of the particle size is preferably 10% or less.

(Thermoplastic Resin)

Various thermoplastic resins may be added in the curable resin composition of the present invention for the purpose of, for example, improving the properties of the composition. Various thermoplastic resins are usable, and examples thereof include, but not limited to, acrylic resins typically exemplified by polymethyl methacrylate resins (for example, Optorez manufactured by Hitachi Chemical) such as homopolymers of methyl methacrylate, and random, block or graft copolymers of methyl methacrylate and other monomers, and polybutyl acrylate resins such as homopolymers of butyl acrylate, and random, block or graft copolymers of butyl acrylate and other monomers; polycarbonate resins (for example, APEC manufactured by Teijin) such as polycarbonate resins containing a monomer unit such as bisphenol A or 3,3,5-trimethylcyclohexylidene bisphenol; cycloolefin resins (for example, APEL manufactured by Mitsui Chemicals, ZEONOR and ZEONEX manufactured by Zeon Corporation, and ARTON manufactured by JSR) such as homopolymer or copolymer resins of norbornene derivatives, vinylmonomers, or the like, resins obtained by ring-opening metathesis polymerization of norbornene derivatives, and hydrogenation products thereof; olefin-maleimide resins (for example, TI-PAS manufactured by Tosoh) such as copolymers of ethylene and maleimide; polyester resins (for example, O-PET manufactured by Kanebo) such as polyesters obtained by polycondensation of bisphenols (e.g. bisphenol A, bis(4-(2-hydroxyethoxy)phenyl)fluorene) or diols (e.g. diethylene glycol) with phthalic acids (e.g. terephthalic acid, isophthalic acid) or aliphatic dicarboxylic acids; polyethersulfone resins, polyarylate resins, polyvinyl acetal resins, polyethylene resins, polypropylene resins, polystyrene resins, polyamide resins, silicone resins, and fluorine resins, as well as rubbery resins such as natural rubber and EPDM.

The thermoplastic resin may contain a carbon-carbon double bond reactive with a SiH group or/and a SiH group in the molecule. In view of higher toughness of a cured product to be obtained, the thermoplastic resin preferably contains at least one carbon-carbon double bond reactive with a SiH group or/and SiH group per molecule on average.

The thermoplastic resin may contain other crosslinkable groups. Examples of such crosslinkable groups include an epoxy group, amino group, radical-polymerizable unsaturated groups, carboxyl group, isocyanate group, hydroxyl group, and alkoxysilyl groups. In view of higher thermal resistance of a cured product to be obtained, the thermoplastic resin preferably contains at least one crosslinkable group per molecule on average.

Although the molecular weight of the thermoplastic resin is not particularly limited, the number average molecular weight of the thermoplastic resin is preferably 10,000 or less, and more preferably 5000 or less, in view of better compatibility with the component (A) and the component (B). Meanwhile, the number average molecular weight of the thermoplastic resin is preferably 10,000 or more, and more preferably 100,000 or more, in view of higher toughness of a cured product to be obtained. The molecular weight distribution is also not particularly limited, and is preferably 3 or less, more preferably 2 or less, and still more preferably 1.5 or less from the viewpoint that the viscosity of the mixture tends to be low, and thus the moldability tends to be better.

The amount of the thermoplastic resin added is not particularly limited. The minimum amount of the thermoplastic resin is preferably 5% by weight, and more preferably 10% by weight, of the whole curable resin composition, while the maximum amount is preferably 50% by weight, and more preferably 30% by weight, of the whole curable resin composition. If the addition amount is smaller, a cured product to be obtained tends to be brittle. If the addition amount is larger, the thermal resistance (elastic modulus at high temperatures) tends to be low.

The thermoplastic resin may be used alone, or a plurality thereof may be used in combination.

The thermoplastic resin may, for example, be homogeneously dissolved in the component (A) or/and the component (B) prior to mixing, or be crushed into particles prior to mixing, or be dissolved in a solvent prior to mixing, for dispersion. In view of higher transparency of a cured product to be obtained, the thermoplastic resin is preferably homogeneously dissolved in the component (A) or/and the component (B) prior to mixing. In this case, the thermoplastic resin may be directly dissolved in the component (A) or/and the component (B). Alternatively, the thermoplastic resin may be homogeneously mixed using a solvent or the like, and the solvent may then be removed so as to give a homogeneous dispersion or/and mixture.

In the case of dispersing the thermoplastic resin, various average particle sizes may be employed; however, the minimum average particle size is preferably 10 nm, and the maximum average particle size is preferably 10 μm. The particle system may have a distribution, and may either be monodispersed or have a plurality of peak particle sizes. From the viewpoint that the viscosity of the curable resin composition tends to be low, and thus the moldability tends to be better, the coefficient of variation of the particle size is preferably 10% or less.

(Anti-Aging Agents)

An anti-aging agent may be added in the curable resin composition of the present invention. Examples of the anti-aging agent include, in addition to anti-aging agents commonly used such as hindered phenol anti-aging agents, citric acid, phosphoric acid, and sulfur anti-aging agents.

Examples of the hindered phenol anti-aging agents include Irganox 1010 available from Ciba Specialty Chemicals, and other various agents.

Examples of the sulfur anti-aging agents include mercaptans, mercaptan salts, sulfides including sulfide carboxylic acid esters and hindered phenol sulfides, polysulfides, dithiocarboxylic acid salts, thioureas, thiophosphates, sulfonium compounds, thioaldehydes, thioketones, mercaptals, mercaptols, monothio acids, polythio acids, thioamides, and sulfoxides.

These anti-aging agents may be used alone, or two or more kinds thereof may be used in combination.

(Radical Inhibitor)

A radical inhibitor may be added in the curable resin composition of the present invention. Examples of the radical inhibitor include phenolic radical inhibitors such as 2,6-di-tert-butyl-4-methylphenol (BHT), 2,2'-methylene-bis (4-methyl-6-tert-butylphenol), and tetrakis(methylene-3-(3,5-di-tert-butyl-4-hydroxyphenyl)propionate)methane; and aminic radical inhibitors such as phenyl-β-naphthylamine, α-naphthylamine, N,N'-di-sec-butyl-p-phenylenediamine, phenothiazine and N,N'-diphenyl-p-phenylenediamine.

These radical inhibitors may be used alone, or two or more kinds thereof may be used in combination.

(Ultraviolet Absorber)

An ultraviolet absorber may be added in the curable resin composition of the present invention. Examples of the ultraviolet absorber include 2(2'-hydroxy-3',5'-di-tert-butylphenyl)benzotriazole, and bis(2,2,6,6-tetramethyl-4-piperidine)sebacate.

These ultraviolet absorbers may be used alone, two or more kinds thereof may be used in combination.

(Solvent)

The curable resin composition of the present invention may be dissolved in a solvent before use. Usable solvents are not particularly limited, and specific examples thereof include hydrocarbon solvents such as benzene, toluene, hexane and heptane; ether solvents such as tetrahydrofuran, 1,4-dioxane, 1,3-dioxolane and diethyl ether; ketone solvents such as acetone, methyl ethyl ketone, and methyl isobutyl ketone; and halogen solvents such as chloroform, methylene chloride and 1,2-dichloroethane.

As the solvent, toluene, tetrahydrofuran, 1,3-dioxolane, and chloroform are preferred.

Although various amounts of the solvent may be used, the minimum amount is preferably 0.1 mL, and the maximum amount is preferably 10 mL, per g of the curable resin composition used. If the amount is smaller, the effects of the solvent, such as reduction in viscosity, are difficult to obtain, while if the amount is larger, problems such as thermal cracking due to the solvent remaining in the materials tend to occur. Moreover, such a larger amount is disadvantageous in cost, thereby lowering the industrial utility value.

The solvent may be used alone, or two or more thereof may be used as a mixed solvent.

(Additives for Light-Emitting Diode)

Furthermore, the curable resin composition of the present invention may contain additives for improving various properties of light-emitting diodes as needed. Examples of the additives include: phosphors which, when they absorb light from light-emitting elements, emit long-wavelength fluorescent light, such as cerium-doped yttrium-aluminum-garnet phosphors; colorants which absorb specific wavelengths, such as blueing agents; diffusing materials for diffusing light, such as titanium oxide, aluminum oxide, melamine resin, CTU guanamine resin, and benzoguanamine resin; and heat conductive fillers including metal oxides such as aluminosilicate, and metal nitrides such as aluminum nitride and boron nitride.

The additives for improving the properties of light-emitting diodes may be contained uniformly or with a concentration gradient.

(Mold Release Agent)

In order to improve the mold releasability during molding, various mold release agents may be added in the curable resin composition of the present invention.

Example of the mold release agents include the component (G) explained above, and waxes. Examples of the waxes include natural waxes, synthetic waxes, oxidized or nonoxidized polyolefins, and polyethylene waxes.

Here, it is better not to use the mold release agent in the case where sufficient moldability can be ensured without addition of the mold release agent.

(Other Additives)

Other additives such as colorants, flame retardants, flame retardant promoters, surfactants, antifoaming agents, emulsifiers, leveling agents, cissing inhibitors, ion trapping agents such as antimony-bismuth compounds, thixotropic agents, tackifiers, storage stability improvers, antiozonants, photostabilizers, thickeners, plasticizers, reactive diluents, antioxidants, thermal stabilizers, electrical conductivity-imparting agents, antistatic agents, radiation blockers, nucleating agents, phosphorus-based peroxide decomposers, lubricants, pigments, metal deactivators, thermal conductivity-imparting agents and property modifiers may be added in the curable resin composition of the present invention as long as they do not impair the objects and effects of the present invention.

(B-Staging)

With regard to the curable resin composition of the present invention, ingredients including the components and additives may be used as they are, or may be used after partially reacted (B-staged) by heating or the like. B-staging enables viscosity adjustment and adjustment of moldability during transfer molding. Moreover, B-staging has an effect in further suppressing shrinkage on curing.

(Properties of Curable Resin Composition)

As the curable resin composition of the present invention, compositions formed from various combinations as mentioned above can be used. In view of good moldability during transfer molding or the like, curable resin compositions having fluidity at temperatures of 150° C. or lower are preferred.

The curability of the curable resin composition may be appropriately set. In view of short molding cycle, the gelation time at 120° C. is preferably 120 seconds or shorter, and more preferably 60 seconds or shorter. The gelation time at 150° C. is preferably 60 seconds or shorter, and more preferably 30 seconds or shorter. The gelation time at 100° C. is preferably 180 seconds or shorter, and more preferably 120 seconds or shorter.

The above gelation time is measured as follows. An aluminum foil having a thickness of 50 µm is placed on an electric hot plate set to a predetermined temperature, and 100 mg of a curable resin composition is put on the foil. Then, the time thereafter until the curable resin composition is gelated is measured and determined as the gelation time.

In the production process using the curable resin composition, from the viewpoint that processing problems due to formation of voids in the curable resin composition and outgassing from the curable resin composition are unlikely to occur, the composition preferably shows a weight loss during curing of at most 5% by weight, more preferably at most 3% by weight, and still more preferably at most 1% by weight.

The weight loss during curing is determined as follows. A sealant in an amount of 10 mg is heated from room temperature to 150° C. at a temperature increase rate of 10° C./min by using a thermogravimetric analyzer, and then the ratio of the weight lost to the initial weight is defined as the weight loss.

From the viewpoint that the curable resin composition is unlikely to cause a problem of silicone contamination when used for electronic materials, volatiles from the curable resin composition in this case preferably have a Si atom content of 1% or less.

(Properties of Cured Product)

In view of good thermal resistance, a cured product obtained by curing the curable resin composition preferably has a Tg of at least 100° C., and more preferably at least 150° C.

This Tg is determined as follows. A tan δ peak temperature obtained in a dynamic viscoelasticity measurement (using DVA-200 produced by IT Keisoku Seigyo) with a 3 mm×5 mm×30 mm prismatic sample under the conditions of: tensile mode; measurement frequency of 10 Hz; strain of 0.1%; static/dynamic load ratio of 1.5; and temperature increase rate of 5° C./min is defined as Tg.

In addition, from the viewpoint that problems such as ion migration are less likely to occur to a lead frame or the like, and the reliability is improved, the content of ions extracted from the cured product is preferably less than 10 ppm, more preferably less than 5 ppm, and still more preferably less than 1 ppm.

In this case, the content of extracted ions is determined in the following manner. Cut pieces of a cured product (1 g) are put together with 50 mL of ultrapure water into a Teflon (registered trademark) container, and the container is then sealed and treated at 121° C. and 2 atm for 20 hours. The obtained extract is analyzed by ICP mass spectrometry (using HP-4500 produced by Yokogawa Analytical Systems), and the obtained values of the contents of Na and K are converted into concentrations in the cured product used. Meanwhile, the same extract is analyzed by ion chromatography (using DX-500 produced by Dionex; column: AS12-SC), and the obtained values of the contents of Cl and Br are converted into concentrations in the cured product used. The contents of Na, K, Cl and Br in the cured product thus obtained are summed and the sum is defined as the content of extracted ions.

The linear expansion coefficient of the cured product is not particularly limited; however, in terms of higher adhesion to metal such as a lead frame or ceramics or the like, the average linear expansion coefficient between 23° C. and 150° C. is preferably at most 30 ppm, more preferably at most 20 ppm, and still more preferably at most 10 ppm.

Preferably, a cured product of the curable resin composition of the present invention has a spectral reflectance of 80R % or more at 420 nm, 440 nm, and 460 nm, and has a spectral reflectance retention rate ([spectral reflectance after thermal resistance test]/[initial spectral reflectance]×100) of 90% or more after a thermal resistance test at a temperature of 180° C. for 72 hours.

The spectral reflectance of the cured product is determined as follows.

Spectral reflectances at wavelengths of 400 nm to 700 nm (20 nm interval) are measured using a micro spectrocolorimeter (VSS400 produced by NIPPON DENSHOKU INDUSTRIES CO., LTD). Here, an average of values measured at arbitrary four points (measurement area: 0.1 mmφ) on the upper surface of the package is defined as the measured value at each wavelength.

In view of higher light extraction efficiency of light-emitting diodes, the spectral reflectance is preferably 75% or more, and more preferably 80% or more, in a wavelength range of 420 nm to 700 nm.

Also, the retention rate of a spectral reflectance after a thermal resistance test (for example, test with heating at 180° C. in an oven for 72 hours) to an initial spectral reflectance is determined according to the following equation:

Retention rate (%)=(spectral reflectance after thermal resistance test)/(initial spectral reflectance)×100.

In view of high reliability in use for electronic materials, the retention rate is preferably 80% or more, more preferably 85% or more, and still more preferably 90% or more.

A surface of a molded article formed by curing the curable resin composition of the present invention preferably has a light reflectance at a wavelength of 470 nm of 90% or more, more preferably 95% or more, still more preferably 97% or more, and particularly preferably 99% or more.

The light reflectance of the surface can be measured as follows.

A void-free molded article having a thickness of 0.5 mm is prepared by press-molding under a predetermined temperature condition using a PET film as a mold release film. The obtained molded article is subjected to predetermined post-curing as necessary. The total reflection at a wavelength of 470 nm of the resulting molded article is measured using a spectrophotometer equipped with an integrating sphere to determine the light reflectance.

(Curable Resin Composition Tablet)

The curable resin composition of the present invention may be formed into curable resin composition tablets when it contains at least the component (F) in addition to the components (A) to (E).

Specifically, the curable resin composition tablet characteristically contains the components (A) and (B), at least one of which is a liquid having a viscosity of at most 50 Pa·s at a temperature of 23° C., the component (C) for curing the components (A) and (B), the components (E) and (F), which are both powder, as well as the component (D). Regarding the curable resin composition tablet, the whole curable resin composition becomes flowable when the viscosities of the components (A) and (B) are reduced at high temperatures. When heating is further continued, a curing reaction proceeds to allow molding into desired shapes.

The molding method is not particularly limited, and methods generally employed for molding curable resin compositions, such as transfer molding and compression molding, may be used. In such molding methods, if the curable resin composition as a material is in the form of paste or clay, a given shape cannot be maintained so that mutual adhesion, integration, or deformation occurs. Thus, it is very difficult to measure or transfer the curable resin composition, and supply it to a molding machine. In contrast, if the curable resin composition is in a tablet form, it can be easily measured, transferred, or supplied to a molding machine and also allows automation, which significantly increases productivity. The tablets herein refer to solid bodies which each maintain a given shape at room temperature, do not practically change in shape with time, and do not adhere to or integrate one another when contacted to one another.

The shape of the tablet of the present invention is not particularly limited, and examples thereof include a cylindrical shape, a prismatic shape, a disk shape, a spherical shape, and the like. A cylindrical shape that is common for transfer molding is preferred.

The total ratio (hereinafter, also referred to as filling proportion) of the component (E) and the component (F) is preferably 70% to 95% by weight of the curable resin composition tablet of the present invention. The ratio between the component (E) and the component (F) in the filling proportion is not particularly limited, and may be freely set.

In the case of the filling proportion of not more than 70% by weight, the following problems may occur: a cured product to be obtained has an excessively high coefficient of thermal expansion, leading to changes in the size of the molded article; or the resulting curable resin composition is in the form of hard paste or clay so that it cannot be formed into tablets. In the case of the filling proportion of not less than 95% by weight, the viscosity at high temperatures may be too high, deteriorating the moldability, or tablets to be obtained may be too brittle.

In the curable resin composition of the present invention, in the case where at least one of the component (A) and the component (B) is liquid at normal temperature, the curable resin composition tends to be in the form of paste or clay when the filling proportion is low. In this case, although the curable resin composition cannot be formed into tablets, it tends to have better moldability at high temperatures. In contrast, in the case of high filling proportion, the curable resin composition tends to be in the form of flake or powder due to a low amount of flowing components. These forms can be pressed into tablets by compression; however, they tend to have poor fluidity at high temperatures, leading to lower moldability. Conventionally, it has been difficult to achieve both formability into tablets and moldability by simply increasing the filling proportion.

However, the inventors of the present invention have found that it is possible for the curable resin composition of the present invention to ensure both formability into tablets and moldability if particles having a size of 12 μm or less account for 40% by volume or more of the total powder of the component (E) and the component (F).

The reason is presumably thought as follows. In a mixed system of liquids and particles, the liquid components are supposed to cover the surface of the particles, and excess liquid components remaining after covering all the particles are considered to contribute to deformation. Hence, even when the filling proportion is the same, the larger the proportion of small particles, the greater the total surface area, and in turn, the larger amount of the liquid components is required for covering. This is thought to be why deformation tends not to occur. Since the viscosity of liquid significantly decreases at high temperatures, changes in fluidity at high temperatures are small when the proportion of small particles varies. At low temperatures, on the other hand, since the viscosity is high, a composition containing a large proportion of small particles is thought to fail to flow like a paste or clay form, and therefore have a flake or powder form.

In other words, by increasing the proportion of small particles in particles, it is possible to harden a curable resin composition at normal temperature while maintaining its fluidity obtainable at high temperatures. This finding is not obvious from the literatures (JP-A 2008-112977, JP-A 2009-155415) teaching the use of epoxy resin or silicone resin which are solid at normal temperature, or from Patent Literature 3 which does not teach the particle size distribution but only describes the average particle size.

(Semiconductor Package)

The semiconductor package herein refers to a member provided in order to support and immobilize or/and protect a semiconductor element or/and an external lead-out electrode or the like. The semiconductor package may be one not directly covering a semiconductor element but supporting and immobilizing an external lead-out electrode or the like, or may be one forming a periphery or bottom of a semiconductor element, such as reflectors of light-emitting diodes.

Examples of the semiconductor element in this case include various semiconductor elements, for example, integrated circuits such as ICs and LSIs, elements such as transistors, diodes and light-emitting diodes, and light-receiving elements such as CCDs.

The form of the semiconductor package is not particularly limited. The effects of the present invention tend to be better achieved particularly if the semiconductor package substantially has a form (MAP type) in which resin is formed on one surface of metal.

In the case where, for example, the semiconductor package of the present invention does not directly cover a semiconductor element as mentioned earlier, a sealant may also be used for sealing. Examples of the usable sealant include conventionally used sealing resins such as epoxy resin, silicone resin, acryl resin, urea resin, and imido resin. Moreover, sealants made of curable resin compositions each containing an aliphatic organic compound having at least two carbon-carbon double bonds reactive with SiH groups per molecule, a compound containing at least two SiH groups per molecule, and a hydrosilylation catalyst, as proposed in JP-A 2002-80733 and JP-A 2002-88244, may be used. Use of such a sealant is preferred from the viewpoint that higher adhesion to the package resin is achieved, and that an effect of the present invention, high light resistance, is remarkably shown due to high transparency. Also, sealing can be carried out by hermetic sealing by covering with glass or the like without any resin sealant.

Furthermore, a lens may also be used in the case of light-emitting diodes, light-receiving elements and the like. It is also possible to mold a sealant into a lens shape so that the sealant functions as lens.

(Molding Method)

With regard to the molding method of the semiconductor package according to the present invention, various methods are applicable. For instance, various molding methods generally used for thermoplastic resins or thermosetting resins (e.g. epoxy resin, silicone resin) may be used, such as injection molding, transfer molding, RIM molding, casting molding, press molding, and compression molding. Of these, transfer molding is preferred from the viewpoint that the molding cycle is shorter and the moldability is better. Although the molding conditions, for example the molding temperature, can be appropriately set, the molding temperature is preferably not lower than 100° C., more preferably not lower than 120° C., and still more preferably not lower than 150° C., in terms of more rapid curing, shorter molding cycle, and better moldability. It is also optional to carry out post-curing (after-cure) as needed after molding by the aforementioned various methods. Post-curing tends to lead to higher thermal resistance.

The molding may be performed at a constant temperature, or may be performed while the temperature is changed in multiple steps or continuously as needed. Rather than a reaction at a constant temperature, a reaction at temperatures increasing in multiple steps or continuously is preferred from the viewpoint that distortion-free, homogeneous cured products are easily obtained. On the other hand, from the viewpoint that the molding cycle can be shortened, curing at a constant temperature is preferred.

Although various curing times may be employed, relatively a long time reaction at low temperatures is preferred rather than a short time reaction at high temperatures, from the viewpoint that distortion-free, homogeneous cured products are easily obtained. On the other hand, from the viewpoint that the molding cycle can be shortened, a short time reaction at high temperatures is preferred.

Various pressures during molding may be employed as needed, and molding can be carried out under ordinary pressure, high pressure, or reduced pressure. Curing under reduced pressure is preferred from the viewpoint that formation of voids can be suppressed, better filling property is achieved, and it is easy to remove possible volatiles. Curing under increased pressure is preferred from the viewpoint that cracks in the molded article can be prevented.

(Applications of Light-Emitting Diode)

The semiconductor of the present invention can be used in various conventionally known applications. Specifically, it can be used in applications including LSIs such as Logic and Memory LSIs, various sensors, and light-emitting or receiving devices. Moreover, in the case where the semiconductor is a light-emitting diode, it can also be used in various conventionally known applications. Specifically, it can be used in applications including backlights for liquid crystal display devices and the like, lighting devices, sensor light sources, vehicle instrument light sources, signaling lights, indicator lights, indicating devices, light sources of planar light emitters, displays, ornaments, various lights, and the like.

(Warpage)

In the case where the curable resin composition of the present invention is molded on one surface of a lead frame for light-emitting diodes to form a package, a warpage of the package is preferably at most ±1.0 mm.

The warpage is measured based on a method for measuring the maximum warpage described in JIS C 6481. Specifically, a semiconductor package is vertically hung at the center of one side thereof, and a straight edge ruler is applied in parallel with the side. The straight edge ruler is further applied on a concave surface of the semiconductor package. Using a metal rule, the largest distance between the straight edge ruler and the substrate surface of the semiconductor package is measured in mm unit. In the case where the resin is molded on the concave surface of the semiconductor package, the largest distance between the straight edge ruler and the resin surface formed on the semiconductor package is measured in mm unit using the metal rule. Then, a value obtained by subtracting the thickness of the resin from the measured value is rounded in mm unit.

The same measurements are successively performed on other sides, and the maximum value among the obtained largest distances is defined as warpage. Here, the semiconductor package described in (Molding method) in EXAMPLES was used for the measurement of warpage.

EXAMPLES

Examples and comparative examples of the present invention are shown below; however, the present invention is not limited thereto.

Synthesis Example 1

A stirrer, a drip funnel and a condenser tube were set in a four-necked 5-L flask. To this flask were added 1,800 g of toluene and 1,440 g of 1,3,5,7-tetramethylcyclotetrasiloxane, which were then heated and stirred in an oil bath at 120° C. A mixed solution of 200 g of triallyl isocyanurate, 200 g of toluene and 1.44 mL of a xylene solution (platinum content: 3% by weight) of platinum-vinylsiloxane complex was added dropwise over 50 minutes. The obtained solution was heated and stirred as it was for 6 hours, and then unreacted 1,3,5,7-tetramethylcyclotetrasiloxane and toluene were removed in vacuo. It was found by $^1$H-NMR measurement that the product had the following structure obtained by a reaction of part of the SiH groups of 1,3,5,7-tetramethylcyclotetrasiloxane with triallyl isocyanurate.

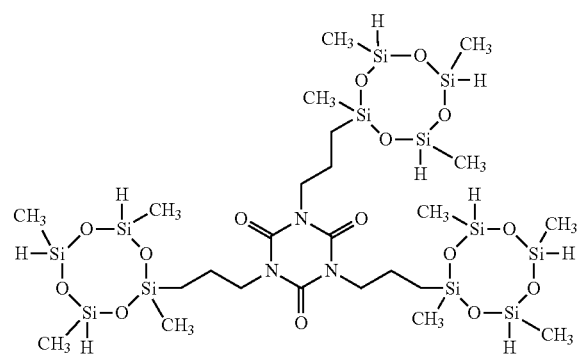 [SMILES: C[SiH]1O[SiH](C)O[Si](C)(CCCn2c(=O)n(CCC[Si]3(C)O[SiH](C)O[SiH](C)O[SiH](C)O3)c(=O)n(CCC[Si]3(C)O[SiH](C)O[SiH](C)O[SiH](C)O3)c2=O)O[SiH](C)O1]

Synthesis Example 2

A 2-L autoclave was charged with 720 g of toluene and 240 g of 1,3,5,7-tetramethylcyclotetrasiloxane, which, after the gas phase was replaced by nitrogen, were heated and stirred at a jacket temperature of 50° C. A mixed solution of 171 g of allyl glycidyl ether, 171 g of toluene and 0.049 g of a xylene solution (platinum content: 3% by weight) of platinum-vinylsiloxane complex was added dropwise over 90 minutes. After completion of the dropwise addition, the jacket temperature was raised to 60° C., a reaction was allowed to proceed for 40 minutes, and the reaction rate of allyl groups was verified to be at least 95% by $^1$H-NMR. A mixed solution of 17 g of triallyl isocyanurate and 17 g of toluene was added dropwise, then, the jacket temperature was raised to 105° C., and a mixed solution of 66 g of triallyl isocyanurate, 66 g of toluene and 0.033 g of a xylene solution (platinum content: 3% by weight) of platinum-vinylsiloxane complex was added dropwise over 30 minutes. Four hours after completion of the dropwise addition, the reaction rate of allyl groups was verified to be at least 95% by $^1$H-NMR, and the reaction was then stopped by cooling. The ratio of unreacted 1,3,5,7-tetramethylcyclotetrasiloxane was 0.8%. Unreacted 1,3,5,7-tetramethylcyclotetrasiloxane, toluene, and byproducts of allyl glycidyl ether ((cis and trans) products via internal rearrangement of the vinyl group of allyl glycidyl ether) were removed in vacuo so as to be present in at most 5,000 ppm in total, so that a colorless transparent liquid was obtained. It was found by $^1$H-NMR measurement that the product was a compound obtained by a reaction of part of the SiH groups of 1,3,5,7-tetramethylcyclotetrasiloxane with allyl glycidyl ether and triallyl isocyanurate, and having the following structure on average.

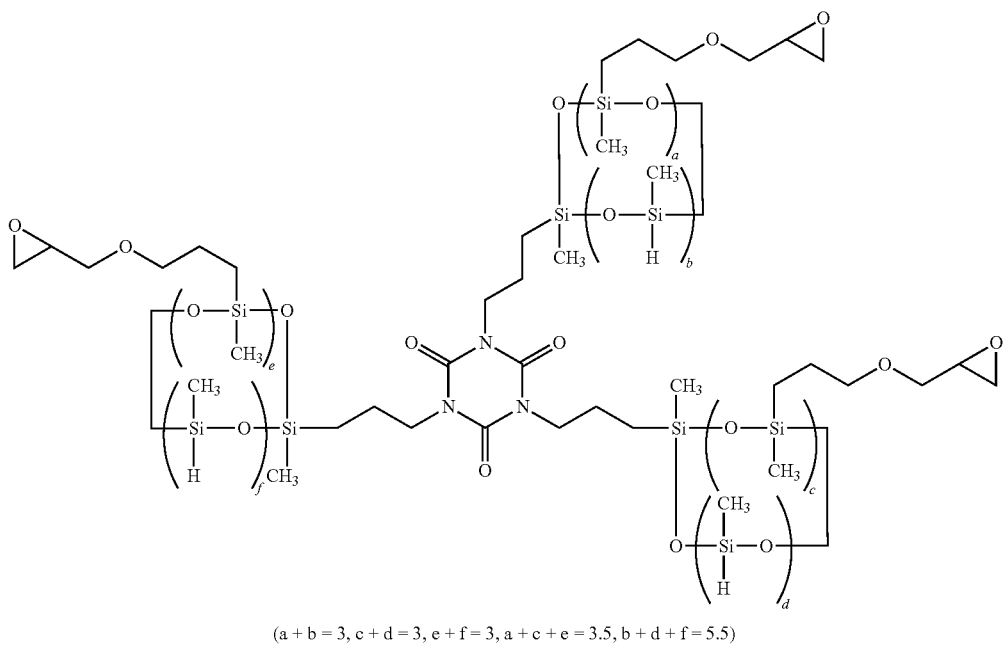

(a + b = 3, c + d = 3, e + f = 3, a + c + e = 3.5, b + d + f = 5.5)

Formulation Examples 1 to 4

Components were mixed in the proportions shown in Table 1 to prepare compositions A to D.

cients of the resulting samples were measured by thermomechanical analysis (TMA). TMA measurement method was as follows.

TABLE 1

|  |  | Formulation Example 1 Composition A | Formulation Example 2 Composition B | Formulation Example 3 Composition C | Formulation Example 4 Composition D |
|---|---|---|---|---|---|
| Component (A) | Triallyl isocyanurate | 40.2 g | 2.9 g | 19.4 g | 58.3 g |
|  | Diallyl monoglycidyl isocyanurate |  | 28.1 g | 13.9 g | 41.71 g |
| Component (B) | Product of Synthesis Example 1 | 59.8 g |  | 29.3 g | 88.21 g |
|  | Product of Synthesis Example 2 |  | 69.0 g | 37.4 g | 112.48 g |
| Component (C) | Xylene solution of platinum-vinylsiloxane complex | 0.050 g | 0.018 g | 0.029 g | 0.09 g |
| Curing retardant | 1-Ethynyl-1-cyclohexanol | 0.3 g | 0.1 g | 0.2 g | 0.49 g |

Examples 1 to 5 and Comparative Example 1

Components were mixed in the proportions shown in Table 2 to prepare curable resin compositions according to the present invention.

Measurement Example 1

The curable resin compositions were press-molded at a temperature of 150° C. Molded articles thus obtained were subjected to post-curing in an oven at 150° C. for one hour and at 180° C. for 0.5 hours. The linear expansion coeffi- The tablet-shaped molded samples with an inner size of 20×20×4.0 mm (in thickness) were cut into a size of 20×10×4.0 mm with a diamond cutter. Using a thermal analyzer (TMA 4000SA, produced by BRUKER), changes in the size of the sample in the 20 mm-direction were measured when the temperature was raised to 280° C. at a temperature increase rate of 5° C./min, held for 20 minutes, and cooled to room temperature in compression mode. Tg was defined as the onset of change in the slope of a chart during heating, and the linear expansion coefficient α1 not higher than the Tg and the linear expansion coefficient α2 not lower than the Tg were determined.

TABLE 2

|  |  | Example 1 | Example 2 | Example 3 | Example 4 | Example 5 | Comparative Example 1 |
|---|---|---|---|---|---|---|---|
| Composition | Composition A | 50 | 50 |  |  |  |  |
|  | Composition B |  |  | 50 | 50 |  | 100 |
|  | Composition C |  |  |  |  | 50 |  |

TABLE 2-continued

| | | Example 1 | Example 2 | Example 3 | Example 4 | Example 5 | Comparative Example 1 |
|---|---|---|---|---|---|---|---|
| Component (D) | PVD-2331* | 50 | 50 | 50 | 50 | 27 | |
| Component (F) | Titanium oxide (PC-3**) | | 300 | | 300 | 239 | |
| | Titanium oxide (R-820**) | 250 | | 250 | | | 250 |
| Component (E) | Silica (MSR-3500***) | 550 | 710 | 550 | 710 | | 550 |
| | Silica (MSR-2212-TN***) | | | | | 557 | |
| Linear expansion coefficient (average linear expansion coefficient between 23° C. and 150° C.) | | 6.9 ppm | 5.0 ppm | 16.1 ppm | 9.1 ppm | 11.0 ppm | 33.0 ppm |

Values of the components are shown as relative percentages by weight.
In the Examples and Comparative Example, components in predetermined proportions were weighed so as to be 100 g in total, and homogeneously mixed to prepare curable compositions.
*produced by Gelest, linear methyl phenyl silicone containing a vinyl group at both terminals (the amount of phenyl groups is 22 to 25 mol % of the total substituents)
**produced by Ishihara Sangyo Kaisha, Ltd.
***produced by Tatsumori Ltd.

As shown in Table 2, the curable resin compositions of the present invention resulted in small linear expansion coefficients.

The curable resin composition in Example 5 was subjected to transfer molding with a silver-plated copper lead frame to give a package having a form (MAP type) in which resin is formed on one surface of metal. The molding was performed under the following conditions.

tance test (test with heating at 180° C. in an oven for 72 hours) to an initial spectral reflectance was determined according to the following equation:

Retention rate (%)=(spectral reflectance after thermal resistance test)/(initial spectral reflectance)×100.

Table 3 shows the results of spectral reflectance.

TABLE 3

| | | | Example 5 | Comparative Example 2 | Comparative Example 3 | Comparative Example 4 | Comparative Example 5 | Comparative Example 6 |
|---|---|---|---|---|---|---|---|---|
| Spectral reflectance (R %) | 420 nm | Initial | 86 | 83 | 58 | 65 | 63 | 72 |
| | | After thermal resistance test (at 180° C. for 72 hours) | 85 | 60 | 10 | 16 | 6 | 14 |
| | | Retention rate (%) | 99 | 73 | 17 | 25 | 9 | 20 |
| | 440 nm | Initial | 94 | 89 | 64 | 71 | 67 | 76 |
| | | After thermal resistance test (at 180° C. for 72 hours) | 92 | 65 | 12 | 21 | 7 | 16 |
| | | Retention rate (%) | 98 | 74 | 19 | 29 | 10 | 21 |
| | 460 nm | Initial | 95 | 90 | 68 | 75 | 70 | 79 |
| | | After thermal resistance test (at 180° C. for 72 hours) | 93 | 69 | 15 | 26 | 8 | 17 |
| | | Retention rate (%) | 99 | 76 | 22 | 34 | 12 | 22 |

Comparative Example 2: Package LED equipped with EVERLEDS produced by Panasonic Corporation
Comparative Example 3: NSSM009B produced by Nichia Corporation
Comparative Example 4: XW1147B produced by Stanley
Comparative Example 5: LBG6SP-V2BB-35-1 produced by OSRAM
Comparative Example 6: LWG6SP-CBEA-5K8L-1 produced by OSRAM Molding temperature: 170° C.
Molding time: 180 seconds
Molding pressure: 7.8 to 13.7 MPa
Curing was then performed at 180° C. for one hour after the molding.

Measurement Example 2

Figure 2:
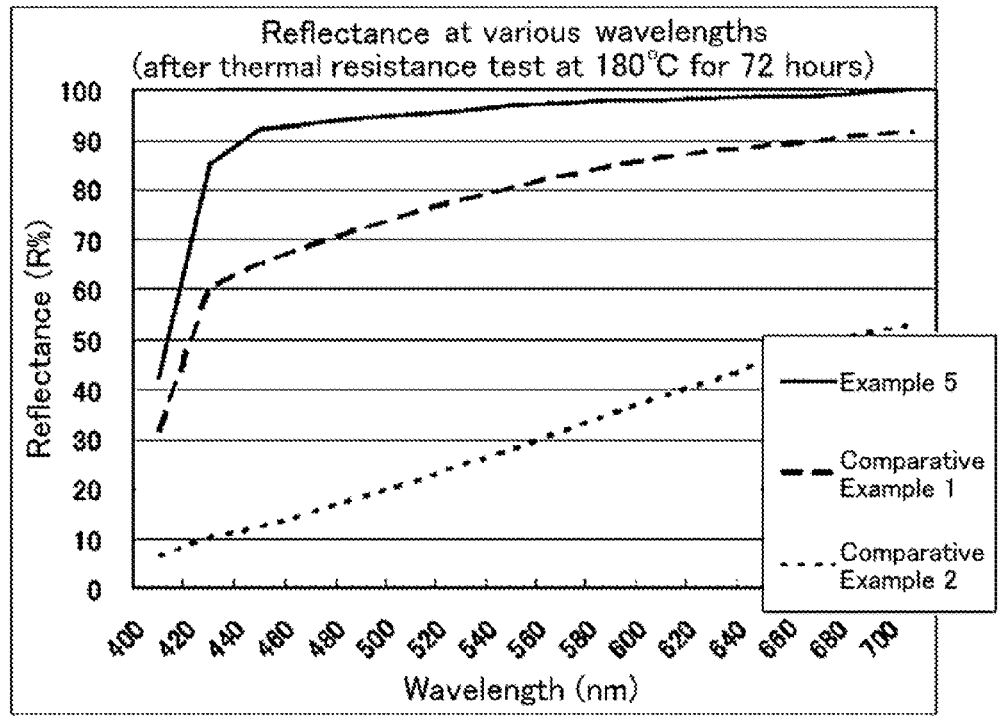
FIG. 2 is a diagram showing reflectances at various wavelengths after a thermal resistance test.

The package of the curable resin composition prepared by the above molding and packages of Comparative Examples 2 to 6 were measured for the spectral reflectance at wavelengths of 400 nm to 700 nm (20 nm interval) by using a micro spectrocolorimeter (VSS400 produced by NIPPON DENSHOKU INDUSTRIES CO., LTD). Here, an average of values measured at arbitrary four points (measurement area: 0.1 mmφ) on the upper surface of the package was defined as the measured value at each wavelength. Also, the retention rate of a spectral reflectance after a thermal resis- FIGS. 1 and 2 show the initial spectral reflectances and spectral reflectances after the thermal resistance test at 180° C. in Example 5 and Comparative Examples 1 and 2.

Examples 6 to 8, Comparative Examples 7 to 9

Table 4 shows the formulation proportions of the components of the curable resin compositions. The following materials were used for the component (D), the component (E), and the component (F).

(Component (D))

PDV2331 (diphenyl dimethyl silicone containing a vinyl group at both terminals thereof, produced by Gelest)

(Component (E))

Spherical silica (produced by TATSUMORI LTD.; MSR-3500; specific gravity: 2.2; average particle size: 36.5 μm; content of particles having a size of 12 μm or less: 19%)

Spherical silica (produced by TATSUMORI LTD.; MSR-2212-TN; specific gravity: 2.2; average particle size: 24.8 μm; content of particles having a size of 12 μm or less: 28%)

Spherical silica (produced by Admatechs; Admafine SO-C2; specific gravity: 2.2; average particle size: 0.5 μm; content of particles having a size of 12 μm or less: 100%)

(Component (F))

Titanium oxide (produced by ISHIHARA SANGYO KAISHA, LTD.; Tipaque PC-3; rutile type; specific gravity: 4.2; chloride process; organic compound on surface: Al, Si; polymethylhydrogensiloxane; average particle size: 0.21 μm; content of particles having a size of 12 μm or less: 100%)

The MAP after molding includes a total of 180 pieces of reflectors with vertical 15 rows and horizontal 12 rows. In each reflector, the upper surface has φ 2.1 mm, the bottom surface has φ 1.8 mm (taper angle: 15°), and the height is 0.55 mm, and an electrode slit having a width of 0.20 mm formed of a white compound obtained by curing the curable resin composition of the present invention is vertically provided at a position 0.45 mm from the right side along the horizontal diameter. A space between the reflectors is 1.1 mm in both of the longitudinal and lateral diameter directions. The lead frame and the die are not particularly limited as long as a reflector with a lead frame satisfying the above

TABLE 4

|  |  |  | Example 6 | | Example 7 | | Example 8 | | Comparative Example 7 | | Comparative Example 8 | | Comparative Example 9 | |
| --- | --- | --- | --- | --- | --- | --- | --- | --- | --- | --- | --- | --- | --- | --- |
|  |  |  | wt % | vol % | wt % | vol % | wt % | vol % | wt % | vol % | wt % | vol % | wt % | vol % |
| Composition A |  |  | 3.4 | 6.6 | 2.7 | 5.3 | 2.4 | 4.9 |  |  | 7.8 | 16.0 | 9.0 | 17.0 |
| Composition B |  |  | 3.8 | 7.4 | 3.1 | 6.1 | 2.8 | 5.6 | 8.1 | 16.0 |  |  |  |  |
| Component (F) | Titanium oxide | PC-3 | 27.8 | 15.0 | 27.4 | 15.0 | 27.1 | 15.0 | 20.9 | 11.2 | 27.0 | 15.0 | 25.0 | 14.0 |
| Component (E) | Spherical silica | MSR-3500 | 61.2 | 62.5 |  |  |  |  |  |  |  |  | 52.0 | 54.0 |
|  |  | MSR-2212-TN |  |  | 63.8 | 66.5 | 64.9 | 68.0 | 71.0 | 72.7 | 65.2 | 69.0 |  |  |
|  |  | SO-2C |  |  |  |  |  |  |  |  |  |  | 14.0 | 15.0 |
| Component (D) |  | PDV-2331 | 3.8 | 8.5 | 3.1 | 7.1 | 2.8 | 6.5 |  |  |  |  |  |  |
| Appearance of resin |  |  | Paste | | Tablet | | Tablet | | Tablet | | Tablet | | Tablet | |
| Warpage before PMC |  |  | <1.0 | | <1.0 | | <1.0 | | 0.0 | | 5.0 | | 3.0 | |
| Warpage after PMC |  |  | 1.0 | | 1.0 | | 1.0 | | 5.0 | | 5.0< | | 3.0< | |
| Reflectance at 470 nm (%) (after PMC) |  |  | 100 | | 100 | | 100 | | 100 | | 100 | | 100 | |

PMC: Post-curing condition (Formulation of Curable Resin Composition)

A preliminarily-mixed powder of the component (F) and the component (E) was added little by little to a separately-prepared mixed solution of the compositions A and B and the component (D), and then mixed and kneaded. In the case where the resulting curable resin composition was in a paste form, the composition was homogenized by mixing and kneading with a stirring rod. In the case of a clay form, it was homogenized by repetition of flattening with a round bar-shaped jig, folding and then flattening again. In the case of a flake or powder form, it was homogenized by grinding in a mortar.

(Forming into Tablet)

In the case where the prepared curable resin composition was in a flake or powder form, it was compressed into tablets with a tableting jig including metal mortars and pestles.

Table 4 shows the final formulation proportions of the components of the curable resin compositions and the appearance of the resins.

(Molding Method)

The curable resin compositions of Examples 6 to 8 and Comparative Examples 7 to 9 shown in Table 4 were each molded on one surface of a lead frame for light-emitting diodes to prepare a package for light-emitting diodes of MAP type (a type of semiconductor packages substantially having a form in which resin is formed on one surface of metal).

Figure 3:
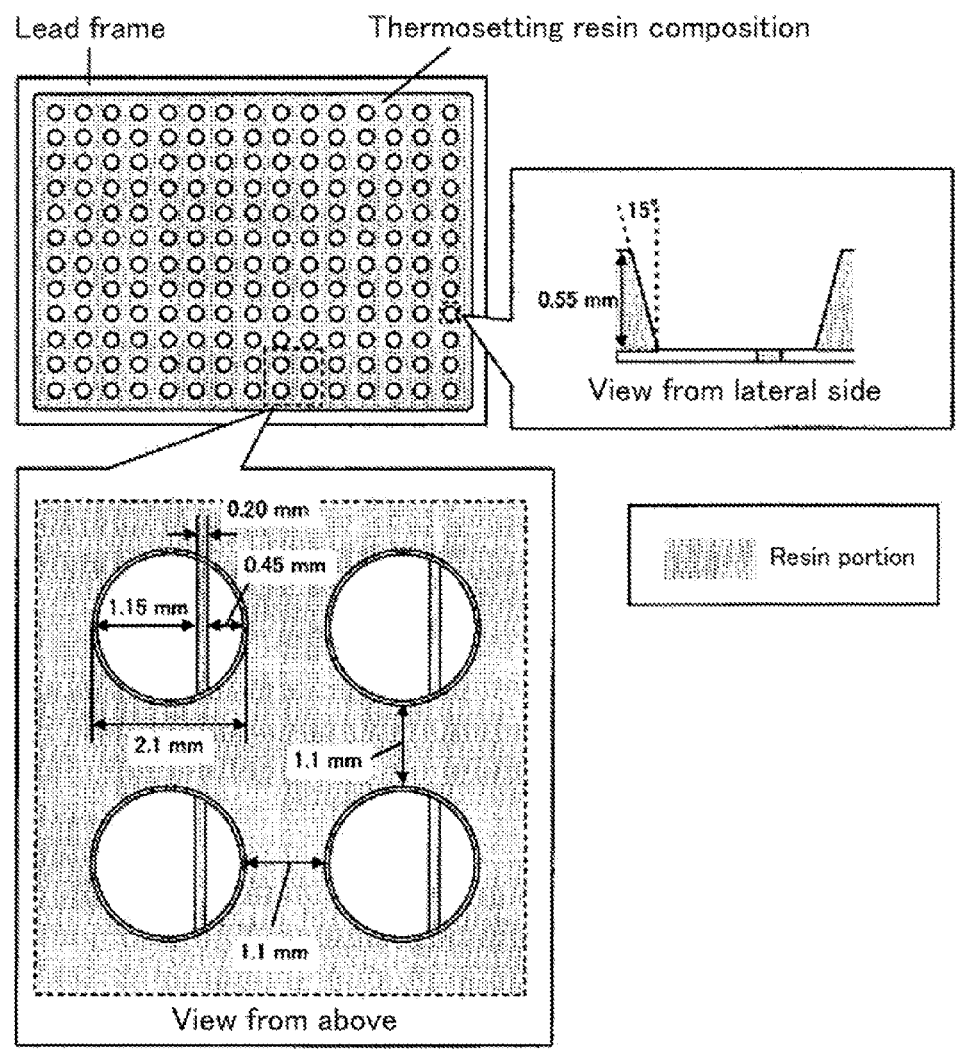
FIG. 3 is a conceptual diagram of a molded article.

An Ag-plated copper lead frame having a size of 50 mm in length, 55 mm in width, and 0.25 mm in thickness is prepared.

requirements can be produced. FIG. 3 shows a conceptual diagram of the molded article.

The transfer molding was performed using a G-Line manual press produced by Apic Yamada Corporation. The mold clamping force was 30 ton, the injection pressure was 8 MPa, and the injection rate was 3 mm/s. An amount of 5.0 g of a white compound was weighed out, formed into a cylindrical shape, loaded in a cylinder, and molded. The molding conditions were a temperature of 150° C. and a time of 5 minutes. The molded product was subjected to post-curing (after-cure) in a hot air oven at 150° C. for one hour and subsequently at 180° C. for 30 minutes.

(Warpage)

Warpage was measured by the following method based on a method of measuring the maximum warpage described in JIS C 6481. A semiconductor package was vertically hung at the center of one side thereof, and a straight edge ruler was applied on a concave surface of the semiconductor package, in parallel with that side. Using a metal rule, the largest distance between the straight edge ruler and the substrate surface of the semiconductor package was then measured in mm unit. In the case where the resin was molded on the concave surface of the semiconductor package, the largest distance between the straight edge ruler and the resin surface formed on the semiconductor package was measured in mm unit using the metal rule. Then, a value obtained by subtracting the thickness of the resin from the measured value was rounded in mm unit. The same measurements were successively performed on other sides, and the maximum value among the measured largest distances was defined as warpage. Table 4 shows the measurement results.

Comparison between the examples and the comparative examples reveals that the addition of the component (D) provided semiconductor packages with a warpage of at most 1.0 mm.

(Light Reflectance at Wavelength of 470 nm)

The curable resin compositions in Table 4 were press-molded at 150° C. for 5 minutes using a stainless steel (SUS304) rectangular mold with an inner size of 80 mm×50 mm and a thickness of 0.5 mm, and a PET film as a mold release film. The produced rectangular plate-shaped press-molded articles were post-cured in an oven at 150° C. for one hour and at 180° C. for 0.5 hours. The light reflectance at a wavelength of 470 nm of the obtained molded articles was measured using a spectrophotometer equipped with an integrating sphere (produced by JASCO Corporation; UV-visible spectrophotometer V-560). The reflectance was measured using a spectralon plate produced by Labsphere, Inc., as the standard plate. Table 4 shows the measurement results.

Examples 9 to 11

Table 5 shows the formulation proportions of the components of the curable resin compositions. The materials used are as follows.

(Component (D))

PDV2331 (diphenyl dimethyl silicone containing a vinyl group at both terminals thereof, produced by Gelest)

(Component (E))

Spherical silica (produced by TATSUMORI LTD.; MSR-3500; specific gravity: 2.2; average particle size: 36.5 μm; content of particles having a size of 12 μm or less: 19%)

(Component (F))

Titanium oxide (produced by ISHIHARA SANGYO KAISHA, LTD.; Tipaque CR-60; rutile type; specific gravity: 4.2; chloride process; surface treatment: aluminum compound; average particle size: 0.21 μm; content of particles having a size of 12 μm or less: 100%)

Titanium oxide (produced by ISHIHARA SANGYO KAISHA, LTD.; Tipaque PC-3; rutile type; specific gravity: 4.2; chloride process; surface treatment: aluminum compound, silicon compound, organosilicon compound; average particle size: 0.21 μm; content of particles having a size of 12 μm or less: 100%)

Titanium oxide (produced by ISHIHARA SANGYO KAISHA, LTD.; Tipaque PF 690; rutile type; specific gravity: 4.2; chloride process; surface treatment: aluminum compound, silicon compound, organic compound; average particle size: 0.21 μm; content of particles having a size of 12 μm or less: 100%)

TABLE 5

| | | Example 9 | | Example 10 | | Example 11 | |
|---|---|---|---|---|---|---|---|
| Surface treatment | Titanium oxide | CR-60 | | PC-3 | | PF690 | |
| | Inorganic compound | Aluminum compound | | Aluminum compound Silica compound | | Aluminum compound Silica compound | |
| | Organic compound | None | | Organosilicon compound | | Organic compound | |
| | | wt % | vol % | wt % | vol % | wt % | vol % |
| Composition A prepared in Formulation Example 1 | | 3.4 | 6.6 | 3.4 | 6.6 | 3.4 | 6.6 |
| Composition B prepared in Formulation Example 2 | | 3.8 | 7.4 | 3.8 | 7.4 | 3.8 | 7.4 |
| Component (F) | Titanium oxide | 27.8 | 15.0 | 27.8 | 15.0 | 27.8 | 15.0 |
| Component (E) | MSR-3500 | 61.2 | 62.5 | 61.2 | 62.5 | 61.2 | 62.5 |
| Component (D) | PDV-2331 | 3.8 | 8.5 | 3.8 | 8.5 | 3.8 | 8.5 |

Table 6 shows the final proportions of the components (A), (B), (C), (D), (E), and (F).

TABLE 6

| | Example 9 | | Example 10 | | Example 11 | |
|---|---|---|---|---|---|---|
| | wt % | vol % | wt % | vol % | wt % | vol % |
| Component (A) | 2.5 | 4.9 | 2.5 | 4.9 | 2.5 | 4.9 |
| Component (B) | 4.6 | 9.0 | 4.6 | 9.0 | 4.6 | 9.0 |
| Component (C) | Trace amount | Trace amount | Trace amount | Trace amount | Trace amount | Trace amount |
| Component (F) | 27.8 | 15.0 | 27.8 | 15.0 | 27.8 | 15.0 |
| Component (E) | 61.2 | 62.5 | 61.2 | 62.5 | 61.2 | 62.5 |
| Component (D) | 3.8 | 8.5 | 3.8 | 8.5 | 3.8 | 8.5 |
| Curing retardant | Trace amount | Trace amount | Trace amount | Trace amount | Trace amount | Trace amount |
| Width of test piece [mm] | 7.54 | | 7.47 | | 7.51 | |
| Thickness of test piece [mm] | 0.55 | | 0.58 | | 0.71 | |

TABLE 6-continued

|  | Example 9 | | Example 10 | | Example 11 | |
| --- | --- | --- | --- | --- | --- | --- |
|  | wt % | vol % | wt % | vol % | wt % | vol % |
| Area [mm²] | 4.18 | | 4.35 | | 5.33 | |
| Maximum load [kgf] | 0.20 | | 0.17 | | 0.21 | |
| Maximum stress [kPa] | 48.8 | | 39.9 | | 39.2 | |
| Light reflectance (%) at a wavelength of 470 nm | 99 | | 100 | | 100 | |

(Formulation of Curable Resin Composition)

A preliminarily-mixed powder of the component (F) and the component (E) was added little by little to a separately-prepared mixed solution of the compositions A and B and the component (D), and then mixed and kneaded. The resulting curable resin composition was homogenized by repetition of flattening with a round bar-shape jig, folding and then flattening again. In the case of a flake or powder form, it was homogenized by grinding in a mortar.

(Preparation of Flat Plate by Heat-Curing of Curable Resin Composition)

The curable resin compositions in Table 5 were press-molded at 150° C. for 5 minutes using a stainless steel (SUS304) rectangular mold with an inner size of 80 mm×50 mm and a thickness of 0.5 mm, and a PET film as a mold release film. The produced rectangular plate-shaped press-molded articles were post-cured in an oven at 150° C. for one hour and at 180° C. for 0.5 hours so that flat plates were prepared.

(Method of Measuring Strength)

Figure 4:
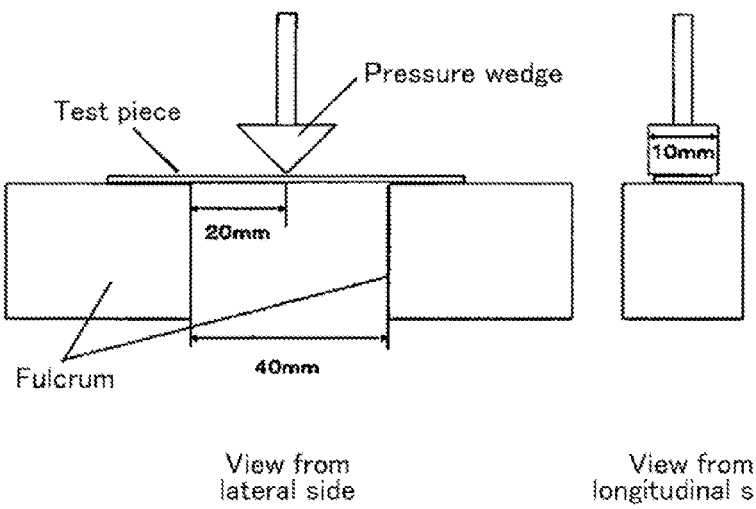
FIG. 4 is a schematic diagram showing a method of measuring the strength.

Test pieces each having a length of at least 50 mm but not more than 80 mm and a width of approximately 7 mm to 8 mm, and having two opposite sides parallel to each other, were cut out from the prepared flat plates. As shown in FIG. 4, each test piece was set between metal fulcrums having a rectangular-parallelepiped shape with round edges, in a manner that the shape of the test piece between the fulcrums was rectangular. The width and thickness of the test piece were measured in 0.01 mm unit at three points located between the fulcrums, and the respective average values were determined as measurement results. The area was calculated from the determined width and thickness of the test piece. Using a texture analyzer (Ta. Plus, produced by Stable Micro Systems Ltd.), load was applied to the test piece at the center thereof at a rate of 2.0 mm/sec by a pressure wedge made of glass, having a right triangle shape with round edges and having a width of 10 mm. The load (maximum load) when the test piece broke was measured. An average value of five measurements was determined as a measurement result. The maximum stress was calculated by dividing the maximum load by the area.

Table 6 shows the measurement results. The results reveal that the maximum load was larger in the case of using titanium oxide surface-treated with an aluminum compound than in the case of using titanium oxide surface-treated with an organosilicon compound or an organic compound in addition to surface treatment with an aluminum compound and a silica compound. This is presumably because the titanium oxide surface-treated only with an aluminum compound as the component (F) has better dispersibility in the curable resin composition.

(Light Reflectance at Wavelength of 470 nm)

The light reflectance at a wavelength of 470 nm of the prepared test pieces was measured using a spectrophotometer equipped with an integrating sphere (produced by JASCO Corporation; UV-visible spectrophotometer V-560). The reflectance was measured using a Spectralon plate produced by Labsphere, Inc., as the standard plate. Table 6 shows the measurement results.

Examples 12 to 18

Components were mixed in the proportions shown in Tables 7 and 8 to prepare the curable resin compositions of the present invention.

Measurement Example 1

The curable resin composition (0.5 g) was sandwiched between a SUS 304 plate (cold-rolled stainless steel, produced by Taiyu Kizai Co., Ltd., 25×70×0.15 mm) masked with a PET film (25×30×0.15 mm) and a polyimide tape, and a SUS 304 plate (25×50×0.15 mm) formed into a L-shape and having punched holes, and then pressed at 5 MPa for 10 seconds at room temperature. The resulting product was compressed and cured under a load of 5 kg for five minutes on a hot plate heated at 170° C. Then, the peel strength of the resin was measured as follows: while the resulting cured molded article was placed on a hot plate heated at 170° C., the SUS 304 plate of the SUS plate test sample was peeled at a rate of 5 mm/s with one end of the SUS 304 plate held fixed, using a push-pull gauge (DS2-20N: IMADA) attached to the L-bent SUS 304 plate, thereby the peel strength was measured. Furthermore, the conditions of the peeled surface were observed, and breakage of the resin itself was evaluated as cohesive failure (CF), and clean peeling of the resin from both SUS plates was evaluated as interfacial delamination (AF).

TABLE 7

|  |  | Example 12 wt % | Example 13 wt % |
| --- | --- | --- | --- |
| Composition | Composition A | 3.4 | 3.3 |
|  | Composition B | 3.8 | 3.7 |
| Component (F) | Titanium oxide (PC-3⁽¹⁾) | 27.8 | 27.3 |
| Component (E) | MSR-3500⁽²⁾ | 61.1 | 60.0 |
| Component (D) | PDV-2331⁽³⁾ | 3.8 | 3.7 |
| Component (G) | Calcium stearate⁽⁴⁾ | 0.2 | 2.0 |
| Peel force (kg/25 mm) |  | 0.12 | 0.18 |
| Failure mode |  | Interfacial delamination (AF) | Interfacial delamination (AF) |
| Mold releasability |  | good | good |

⁽¹⁾produced by Ishihara Sangyo Kaisha, Ltd.
⁽²⁾produced by Tatsumori Ltd.
⁽³⁾produced by Gelest, Linear methyl phenyl silicone containing a vinyl group at both terminals (The amount of phenyl groups is mol % of the total substituents.)
⁽⁴⁾produced by Wako Pure Chemical Industries As shown in Table 7, the curable resin compositions of the present invention can provide materials which are excellent in mold releasability.

(Preparation of MAP (Mold Array Package)-Type Reflector with Lead Frame)

MAP-type reflectors with lead frames were prepared using the curable resin compositions of Examples 14 to 18 shown in Table 8 according to the following method.

An Ag-plated copper lead frame having a size of 50 mm in length, 55 mm in width, and 0.25 mm in thickness is prepared. The MAP after molding includes a total of 180 pieces of reflectors with vertical 15 rows and horizontal 12 rows. In each reflector, the upper surface has φ 2.1 mm, the bottom surface has φ 1.8 mm (taper angle: 15°), and the height is 0.55 mm, and an electrode slit having a width of 0.20 mm formed of a white compound obtained by curing the curable resin composition of the present invention is vertically provided at a position 0.45 mm from the right side along the horizontal diameter. A space between the reflectors is 1.1 mm in both of the longitudinal and lateral diameter directions. The lead frame and die are not particularly limited as long as a reflector with a lead frame satisfying the above requirements can be prepared. The form of this molded article is referred to as 3030MAP type.

The transfer molding was performed using a G-Line manual press produced by Apic Yamada Corporation. The mold clamping force was 30 ton. The injection pressure and the injection rate were set to the values shown in Table 8. An amount of 5.0 g of a white compound was weighed out, formed into a cylindrical shape, loaded in a cylinder, and molded while the surface of the mold was sprayed with a fluorine mold release agent (spray type) (produced by Daikin Industries, Ltd.; Daifree-GA-7500). The molding conditions were a temperature of 170° C. and a time of 3 minutes. The molded product was subjected to post-curing at 180° C. for one hour.

TABLE 8

|  |  | Example 14 | Example 15 | Example 16 | Example 17 | Example 18 |
|---|---|---|---|---|---|---|
| Composition | Composition A (wt %) | 2.7 | 2.7 | 2.7 | 2.7 | 2.7 |
|  | Composition B (wt %) | 3.1 | 3.1 | 3.1 | 3.1 | 3.1 |
| Component (F) | Titanium oxide (PC-3) (wt %) | 63.7 | 63.7 | 63.7 | 63.7 | 63.7 |
| Component (E) | MSR-2212-TN[6] (wt %) | 27.3 | 27.3 | 27.3 | 27.3 | 27.3 |
| Component (D) | PDV-2331 (wt %) | 3.1 | 3.1 | 3.1 | 3.1 | 3.1 |
| Component (G) | Calcium stearate (wt %) | 0.2 | 0.2 | 0 | 0 | 0 |
|  | Compound amount (g) | 5.5 | 5.5 | 5.5 | 5.5 | 5.5 |
| Molding conditions | Injection pressure (Mpa) | 7.9 | 7.7 | 7.7 | 12 | 12 |
|  | Injection rate (mm/s) | 3 | 3 | 3 | 6 | 12 |
| Curing conditions | Temperature (° C.) | 170 | 170 | 170 | 170 | 170 |
|  | Time (min) | 3 | 3 | 3 | 3 | 3 |
| Post-curing conditions | Temperature (° C.) | 180 | 180 | 180 | 180 | 180 |
|  | Time (min) | 60 | 60 | 60 | 60 | 60 |
| Filling rate | % | 100 | 100 | 80 | 95 | 98 |
| Warpage | Obverse warpage or reverse warpage (mm) | None | None | Reverse warpage 0.5 | Reverse warpage 0.5 | Reverse warpage 0.5 |

[6]produced by Tatsumori Ltd.

As shown in Table 8, in molding of the 3030MAP, the systems in which calcium stearate was added showed more favorable MAP filling property, and provided high quality products with almost no warpage. In contrast, the systems in which calcium stearate was not added showed poor filling property, and also provided molded articles with observable warpage. Accordingly, it was found that the addition of the component (G) not only improves the mold releasability as illustrated in Table 7, but also contributes to better resin-filling property, thereby reducing warpage of the molded article.

(Filling Rate)

The filling rate was determined by evaluating the ratio of unfilled area, with the filling rate of the compound resin fully filled in a molding part being regarded as 100%.

(Evaluation of Warpage)

The MAP product was placed on a flat surface with the molded part up. Warpage of the MAP product was defined as obverse warpage when the molded part seen from a right lateral direction was in a concave shape, and defined as reverse warpage when it was in a convex shape. With respect to the degree of warpage, the MAP product was placed on a flat surface, and the largest distance (mm) among the distances from the surface to four distant sides was quantified.

Examples 19 to 22

Components in Table 9 were mixed to provide curable resin compositions according to the present invention. If the resulting curable resin composition was in a paste form, it was homogenized by mixing and kneading with a stirring rod. In the case of a clay form, it was homogenized by repetition of flattening with a round bar-shaped jig, folding and then flattening again. In the case of a flake or powder form, it was homogenized by grinding in a mortar.

TABLE 9

|  |  | Example 19 | | Example 20 | | Example 21 | | Example 22 | |
|---|---|---|---|---|---|---|---|---|---|
|  |  | wt % | vol % | wt % | vol % | wt % | vol % | wt % | vol % |
| Components (A) + (B) + (C) | Composition D | 5.25 | 11.4 | 6.08 | 13.9 | 6.56 | 11.4 | 5.27 | 11.4 |
| Component (D) | PDV-2331 | 2.81 | 7.1 | 3.26 | 8.6 | 3.51 | 7.1 | 2.82 | 7.1 |
| Component (E) | MSR-2212-TN | 58.23 | 66.1 | 47.90 | 57.0 | 72.78 | 66.1 | 58.41 | 66.1 |
| Component (F) | Zinc oxide (#1)[a] | 33.51 | 15.0 | 42.56 | 20.0 |  |  |  |  |

TABLE 9-continued

| | | Example 19 | | Example 20 | | Example 21 | | Example 22 | |
|---|---|---|---|---|---|---|---|---|---|
| | | wt % | vol % | wt % | vol % | wt % | vol % | wt % | vol % |
| | Boron nitride (MBN-010T)[b] | | | | | 16.95 | 15.0 | | |
| | Barium titanate (BT-HP9DX)[c] | | | | | | | 33.31 | 15.0 |
| Component (G) | Calcium stearate | 0.20 | 0.4 | 0.20 | 0.5 | 0.20 | 0.4 | 0.20 | 0.4 |
| Initial reflectance (%) at 470 nm | | 92 | | 94 | | 90 | | 91 | |
| Reflectance after durability test (%) at 470 nm | 180° C. 20 h | 92 | | 93 | | 89 | | 89 | |
| | 85° C./85% RH | 92 | | 94 | | 90 | | 91 | |
| | Metaling (50 MJ) | 94 | | 93 | | 88 | | 90 | |

[a] produced by Sakai Chemical Industry Co., Ltd.; average particle size: 0.6 μm
[b] produced by Mitsui Chemicals, Inc.; average particle size: 1 μm
[c] produced by KCM Corporation Co., Ltd.; average particle size: 0.662 μm (Preparation of Samples)

The curable resin compositions in Table 9 were press-molded at 170° C. for 3 minutes using a stainless steel (SUS304) rectangular mold with an inner size of 80 mm×50 mm and a thickness of 0.5 mm, and a PET film as a mold release film. The prepared rectangular plate-shaped press-molded articles were post-cured in an oven at 180° C. for one hour. The resulting products were cut into a size of 50 mm×25 mm to give samples for evaluation.

As a durability test, a thermal resistance test, a light resistance test, and a constant temperature and humidity test were performed by the below-mentioned methods. Here, the light reflectance at a wavelength of 470 nm of each sample was measured before the durability test, and the measured value was defined as initial reflectance.

(Thermal Resistance Test)

The samples prepared as above were aged for 20 hours in a convection oven (in the air) whose temperature was set to 180° C. Thereafter, the light reflectance at a wavelength of 470 nm of the aged samples was measured.

(Light Resistance Test: Metaling)

A metaling weather meter (Type "M6T") produced by Suga Test Instruments Co., Ltd. was used. The samples prepared as above were irradiated at a black panel temperature of 120° C. and an irradiance of 0.53 kW/m$^2$ until the integrated irradiance reached 50 MJ/m$^2$. Thereafter, the light reflectance at a wavelength of 470 nm of the samples was measured.

(Constant Temperature and Humidity Test: 85° C./85% RH)

A constant low temperature/humidity chamber (LH43-13M) produced by Nagano Science Co., Ltd. was used. The samples prepared as above were aged for 90 hours at a temperature of 85° C. and a humidity of 85% RH. Thereafter, the light reflectance at a wavelength of 470 nm of the aged samples was measured.

(Light Reflectance at Wavelength of 470 nm)

The light reflectance at a wavelength of 470 nm of the samples before and after the durability test was measured using a spectrophotometer equipped with an integrating sphere (produced by JASCO Corporation; UV-visible spectrophotometer V-560). The reflectance was measured using a Spectralon plate produced by Labsphere, Inc., as the standard plate. Table 9 shows the measurement results.

The invention claimed is:

1. A semiconductor package which comprises a cured resin product of a curable resin composition comprising, as essential components,
   (A) an organic compound having at least two carbon-carbon double bonds reactive with SiH groups per molecule which is free of any siloxane (Si—O—Si) units, or, reaction products of one or more kinds of compounds selected from the organic compounds having at least two carbon-carbon double bonds reactive with SiH groups per molecule which are free of any siloxane (Si—O—Si) units, with a compound containing a SiH group
   (B) a compound containing at least two SiH groups per molecule,
   (C) a hydrosilylation catalyst,
   (D) a silicone compound having at least one carbon-carbon double bond reactive with a SiH group per molecule,
   (E) an inorganic filler, and
   (F) a white pigment,
   wherein the component (E) and the component (F) are contained in a total amount of 70% to 95% by weight,
   wherein the cured resin product further comprises a metal,
   wherein the curable resin composition is molded by transfer molding.

2. The semiconductor package according to claim 1, wherein the component (D) is a linear polysiloxane containing a vinyl group at a terminal thereof.

3. The semiconductor package according to claim 1, wherein the component (D) has a weight average molecular weight of at least 1,000 but not more than 1,000,000.

4. The semiconductor package according to claim 1, wherein the component (E) is spherical silica.

5. The semiconductor package according to claim 1, wherein the component (F) has an average particle size of 1.0 μm or less.

6. The semiconductor package according to claim 1, wherein the component (F) is titanium oxide.

7. The semiconductor package according to claim 6, wherein the component (F) is titanium oxide that is surface-treated with an organosiloxane.

8. The semiconductor package according to claim 6, wherein the component (F) is titanium oxide that is surface-treated with an inorganic compound.

9. The semiconductor package according to claim 8, wherein the component (F) is surface-treated with an aluminum compound.

10. The semiconductor package according to claim 1, wherein the component (F) is at least one selected from the group consisting of zinc oxide, zirconium oxide, strontium oxide, niobium oxide, boron nitride, barium titanate, and barium sulfate.

11. The semiconductor package according to claim 1, further comprising (G) a metal soap.

12. The semiconductor package according to claim 11, wherein the component (G) is a metal stearate.

13. The semiconductor package according to claim 12, wherein the component (G) is at least one selected from the group consisting of calcium stearate, magnesium stearate, zinc stearate, and aluminum stearate.

14. The semiconductor package according to claim 11, wherein the component (G) is contained in an amount of 0.01% to 5% by weight of the whole curable resin composition.

15. The semiconductor package according to claim 1, wherein the component (D) is contained in an amount of 30% by weight or more of the total weight of the component (A) and the component (B).

16. The semiconductor package according to claim 1, wherein the component (E) is contained in a total amount of 70% by weight or more of the whole curable resin composition.

17. The semiconductor package according to claim 1, wherein the component (F) is contained in an amount of 10% by weight or more of the whole curable resin composition.

18. The semiconductor package according to claim 1, wherein the cured resin product of the curable resin composition has a spectral reflectance of 80 R % or more at 420 nm, 440 nm, and 460 nm, and has a spectral reflectance retention rate ([spectral reflectance after thermal resistance test]/[initial spectral reflectance]×100) of 90% or more after a thermal resistance test at a temperature of 180° C. for 72 hours.

19. The semiconductor package according to claim 1, wherein a surface of the cured resin product formed by curing the curable resin composition has a light reflectance at a wavelength of 470 nm of 90% or more.

20. The semiconductor package according to claim 1, further comprising a lead frame integrally molded with the cured resin product.

21. The semiconductor package according to claim 1, wherein the semiconductor package substantially comprises a metal and the cured resin product formed on one surface of the metal.

22. A semiconductor component comprising the semiconductor package according to claim 1.

23. A light-emitting diode comprising the semiconductor package according to claim 1.

24. The semiconductor package according to claim 1, wherein when the cured resin product is molded on one surface of a lead frame for light-emitting diodes to form the semiconductor package, and a warpage of the semiconductor package is at most ±1.0 mm.

25. The semiconductor package according to claim 1, wherein the ratio of the number (Y) of SiH groups in the component (B) to the number (X) of carbon-carbon double bonds in the component (A) is $3 \geq Y/X \geq 0.3$.

* * * * *